United States Patent
Sasaki et al.

(10) Patent No.: US 8,190,086 B2
(45) Date of Patent: May 29, 2012

(54) TRANSMISSION METHOD, INTERFACE CIRCUIT, SEMICONDUCTOR DEVICE, SEMICONDUCTOR PACKAGE, SEMICONDUCTOR MODULE AND MEMORY MODULE

(75) Inventors: Hideki Sasaki, Minato-ku (JP); Muneo Fukaishi, Minato-ku (JP); Toru Taura, Minato-ku (JP)

(73) Assignee: NEC Corporation, Tokyo (JP)

( * ) Notice: Subject to any disclaimer, the term of this patent is extended or adjusted under 35 U.S.C. 154(b) by 1128 days.

(21) Appl. No.: 12/065,068

(22) PCT Filed: Aug. 4, 2006

(86) PCT No.: PCT/JP2006/315509
§ 371 (c)(1),
(2), (4) Date: Feb. 27, 2008

(87) PCT Pub. No.: WO2007/029435
PCT Pub. Date: Mar. 15, 2007

(65) Prior Publication Data
US 2009/0233546 A1   Sep. 17, 2009

(30) Foreign Application Priority Data
Sep. 2, 2005  (JP) .................................. 2005-255576

(51) Int. Cl.
*H04B 5/00* (2006.01)
(52) U.S. Cl. ............... 455/41.1; 178/43; 178/46; 178/48
(58) Field of Classification Search ................. 455/41.1; 178/43, 46, 48
See application file for complete search history.

(56) References Cited

U.S. PATENT DOCUMENTS

| | | | | |
|---|---|---|---|---|
| 5,070,500 A | * | 12/1991 | Horinouchi et al. | 365/189.02 |
| 5,424,527 A | * | 6/1995 | Takahira | 235/492 |
| 5,644,108 A | * | 7/1997 | Katsurahira et al. | 178/18.07 |
| 5,701,037 A | * | 12/1997 | Weber et al. | 257/777 |
| 5,812,598 A | * | 9/1998 | Sharma et al. | 375/259 |
| 5,898,738 A | * | 4/1999 | Nagata et al. | 375/326 |
| 6,371,379 B1 | * | 4/2002 | Dames et al. | 235/493 |
| 7,447,492 B2 | * | 11/2008 | Dupuis | 455/333 |
| 7,460,604 B2 | * | 12/2008 | Dupuis | 375/258 |
| 2005/0029351 A1 | * | 2/2005 | Yoshinaga et al. | 235/451 |
| 2005/0159913 A1 | * | 7/2005 | Ariyoshi et al. | 702/122 |
| 2006/0255459 A1 | * | 11/2006 | Muff et al. | 257/738 |
| 2007/0018299 A1 | * | 1/2007 | Koo et al. | 257/686 |

FOREIGN PATENT DOCUMENTS

| | | |
|---|---|---|
| JP | 55-37936 A | 3/1980 |
| JP | 7-221260 A | 8/1995 |
| JP | 8-236696 A | 9/1996 |
| JP | 8-287199 A | 11/1996 |

(Continued)

OTHER PUBLICATIONS

Engilsh Translation of Japanese Patent Publication 2004-348636.*
Analysis and Design of Transceiver Circuit and Inductor Layout for Inductive Inter-chip Wireless Superconnect Miura, et al. pp. 246-249.

(Continued)

*Primary Examiner* — Nay A Maung
*Assistant Examiner* — Erica Fleming-Hall
(74) *Attorney, Agent, or Firm* — Sughrue Mion, PLLC

(57) ABSTRACT

An interface circuit, which uses electromagnetic induction to perform a signal transmission, comprises a transmission coil and a transmission circuit that provides a signal to the transmission coil, thereby causing the transmission coil to output a triangular or roughly triangular magnetic field signal.

35 Claims, 22 Drawing Sheets

FOREIGN PATENT DOCUMENTS

| | | | |
|---|---|---|---|
| JP | 9-79806 | A | 3/1997 |
| JP | 10-341192 | A | 12/1998 |
| JP | 2001-7745 | A | 1/2001 |
| JP | 2004-235875 | A | 8/2004 |
| JP | 2004-348636 | A | 12/2004 |
| JP | 2005-228981 | A | 8/2005 |
| JP | 2005-348264 | A | 12/2005 |
| JP | 2006-50354 | A | 2/2006 |
| JP | 2006-173415 | A | 6/2006 |
| WO | 2005-078795 | A1 | 8/2005 |

OTHER PUBLICATIONS

A. X. Widmer, P.A. Franaszek a DC-Balanced, Partitioned-Block, 8B/10B Transmission Code. vol. 27. No. 5 Sep. 1983. 440-451.

ISSCC 2004/SESSION 7 / TD: Scaling Trends / 7.6 A1.2Gb/s/pin Wireless Superconnect Based on Inductive Inter-Chip Signaling (IIS) Daisuke Mizoguchi, et al.

Looking for new ways to make ultrafast chips, designers explore the third dimension by John Baliga. Chips Go Vertical Mar. 2004 IEEE.

* cited by examiner

TRANSMISSION METHOD, INTERFACE CIRCUIT, SEMICONDUCTOR DEVICE, SEMICONDUCTOR PACKAGE, SEMICONDUCTOR MODULE AND MEMORY MODULE

TECHNICAL FIELD

The present invention relates to a transmission method, an interface circuit, a semiconductor device, a semiconductor package, a printed circuit board, a semiconductor module, a memory module, and a portable device, and more particularly to a transmission method and an interface circuit which enable signal transmissions having high noise immunity, and a semiconductor device and the like which comprise the interface circuit.

BACKGROUND ART

In recent years, several disclosed semiconductor devices comprise a plurality of stacked semiconductor chips in step with the trend of higher integration of circuits incorporated in semiconductor devices.

For example, Non-Patent Document 1 discloses a semiconductor device which comprises semiconductor chips, each formed with through vias and bumps, stacked one on another, where signals are transmitted and power is supplied between the stacked semiconductor chips.

On the other hand, Patent Documents 1, 2 and Non-Patent Document 2 disclose semiconductor devices which employ a non-contact interface circuit for transmitting signals between stacked semiconductor chips using coils formed in each semiconductor chip without using contact means such as through vias, bumps and the like.

In these semiconductor devices, a coil that is formed in one semiconductor chip generates a magnetic field signal, while a coil that is formed in another semiconductor chip receives the magnetic field signal, thereby transmitting signals between chips in a non-contact manner. In the following, the respective devices will be described in detail.

FIG. 1 is a schematic cross-sectional view of a semiconductor device described in Patent Document 1. This semiconductor device is formed with electromagnetic induction coil 102 or 103 on the surfaces of semiconductor chips 100 and 101. Semiconductor chips 100 and 101 are electromagnetically coupled by coils 102 and 103. In this regard, each coil 102 and 103 is provided with ferromagnetic material film 104 or 105 for enhancing a coupling coefficient between coils 102 and coil 103.

Patent Document 1 describes that the semiconductor device can be readily adapted to higher integration and an increase in the number of pins because the coils can be formed using highly accurate film deposition technologies such as CVD (Chemical Vapor Deposition), PVD (Physical Vapor Deposition), sputtering and the like.

Patent Document 1 also describes that since no solder is used, it is possible to eliminate the influence of circuit malfunctions due to the alpha beam.

Patent Document 1 further describes that a characteristic test is conducted after a semiconductor chip has been assembled, and a circuit chip can be readily decomposed and reassembled after confirming the characteristics without using thermal treatments and the like, and the yield rate is expected to increase.

FIG. 2 is a schematic cross-sectional view of a semiconductor device described in Patent Document 2. This semiconductor device comprises a stack of semiconductor chip Ln, which is provided with a transmission device S and a transmission coil SPS connected thereto, and semiconductor chip Ln+x that is provided with reception device E and reception coil SPE connected thereto. This semiconductor device transmits a signal between transmission coil SPS and reception coil SPE.

Patent document 2 describes that this semiconductor device can directly and reliably transmit a signal from the interior of one chip into the interior of an adjoining chip in a direction perpendicular to the chip without imposing extremely high requirements to make mutual adjustments and to ensure surface flatness between respective semiconductor chips.

FIG. 3 is a schematic perspective view of a semiconductor device described in Non-Patent Document 2. In this semiconductor device, a plurality of semiconductor chips 300, 301, 302 and 303 are stacked. Also, coils 304, 305 and 307 that are formed in the semiconductor chips are placed one on another at the same position in the vertical direction. Further, transmission circuit Tx and reception circuit Rx are disposed near the coils. With such a configuration, this semiconductor device transmits a signal between higher and lower semiconductor chips.

Non-Patent Document 2 describes that a low power consumption and broad band interface can be realized.

Non-Patent Document 1: John Baliga, "Chips Go Vertical", IEEE Spectrum, March, pp. 35-39 (2004).
Patent Document 1: JP-7-221260A
Patent Document 2: JP-8-236696A
Non-Patent Document 2: Noriyaki Miura, et al., "Analysis and Design of Transceiver Circuit and Inductor Layout for Inductive Inter-chip Wireless Superconnect", IEEE 2004 Symposium on VLSI Circuits Digest of Technical Papers, pp. 246-249 (2004).
Non-Patent Document 3: A. X. Widmer and P. A. Franaszek, "A DC-Balanced, Partitioned-Block, 8B/10B Transmission Code", IBM J. Res. Develop., Vol. 27, No. 5, pp. 440-451, Sep. (1983)

DISCLOSURE OF THE INVENTION

Problems to be Solved by the Invention

However, the prior art techniques described in the respective documents have a problem in which it is difficult to separate a signal from noise because the waveform of the magnetic field signal received by the reception coil is quite similar to the noise waveform that is introduced into the reception coil from the interior and exterior of the semiconductor device.

FIG. 4 is a waveform chart showing the waveforms at the input and output of transmission device S and reception device E (see FIG. 2) described in Patent Document 2.

Reference numerals U201, IL, U203 and U204 in FIG. 4 correspond to respective input and output terminals shown in FIG. 2. Reference numeral U201 indicates the waveform of an input voltage of transmission device S, while reference numeral IL indicates the waveform of a current which flows through transmission coil SPS. Reference numeral U203 indicates the waveform of a voltage induced in reception coil SPE. Reference numeral U204 indicates the waveform of a voltage output from reception device E.

Transmission device S is applied with rectangular-wave signals such as a digital clock signal, data signal and the like, as indicated by reference numeral U201. On the other hand, current waveform IL flowing through transmission coil SPS, and voltage waveform U203 induced by reception coil SPE present waveforms which have short pulse widths and abrupt peaks.

Current waveform IL flowing through transmission coil SPS presents an abrupt waveform with a narrow pulse width, such as a current which flows only at a rising edge and a falling edge of a rectangular-wave applied to transmission device S. This is understood from the circuit configuration of transmission device S.

FIG. 5 is a circuit diagram showing transmission device S described in Patent Document 2. Beyond invertor 205, invertors 206 and 207 and transmission coil SPs form a loop. While an output voltage of invertor 205 is in phase with an output voltage of invertor 207, a shift occurs for a delay time between invertors 206 and 207. Since a current flows into transmission coil SPS during the shift, the resulting current has a waveform as indicated by reference numeral IL.

On the other hand, a voltage is induced in reception coil SPE in the form of a differentiated waveform of a received magnetic field according to Faraday's electromagnetic induction law. For this reason, a differentiated waveform (−dIL/dt) of IL is induced as shown in FIG. 4. As a result, reception device E is applied with voltage waveform U203 which has a narrow pulse width and an abrupt peak.

Likewise, in the semiconductor device described in Non-Patent Document 2, the reception circuit is applied with a voltage waveform which has a narrow pulse width and an abrupt peak.

FIG. 6 is a waveform chart showing a transmission/reception circuit described in Non-Patent Document 2, and current waveforms or voltage waveforms at respective input and output points thereof. Like Patent Document 2, transmission signal Txdata 308 is a rectangular-wave digital signal, while current IT flowing through a transmission coil presents a waveform of a current which flows only at a rising edge and a falling edge of the rectangular wave.

FIG. 7 is a circuit diagram showing this transmission circuit Tx. When transmission signal Txdata 308 is applied to transmission circuit Tx, a temporal shift occurs between this signal and a signal applied to the coil through Delay Buffer. Current IT flows into the transmission coil during this shift. Though not set forth in the document, it can be readily estimated from the waveform of VR in FIG. 6 that reception voltage VR is a differentiated waveform of current IT which flows through the transmission coil.

Generally, there are a variety of noise sources internal and external to a semiconductor device.

For example, many logic circuits exist within a semiconductor chip, where signal transmissions among the circuits are performed through charge and discharge of capacitors located at the input of a reception circuit. It is widely known that a current flowing in this event presents a waveform quite similar to IL in FIG. 4 or IT in FIG. 6. If a current of such a waveform is introduced into a reception coil as noise, it is apparent that a voltage resulting from the noise presents a waveform similar to that of U203 in FIG. 4 and VR in FIG. 6.

It is also known that a supply current flowing when a transistor is turned ON/OFF presents a waveform such as that of IL in FIG. 4 or IT in FIG. 6.

Further, the reception coil is highly likely to receive a magnetic field from the outside of the semiconductor device. For example, noise associated with an electrostatic discharge or noise due to the switching of a power supply circuit may be introduced into the reception coil.

When such noise is introduced into the reception coil, it is quite difficult in principle to distinguish a reception signal from the noise because the voltage waveform resulting from the noise is quite similar to the voltage waveform based on the authentic reception signal induced in the reception coil, as shown in FIG. 8.

A method is known for canceling noise using a differential transmission. Patent Document 2 describes an example which utilizes this method.

FIG. 9 is an explanatory diagram for describing the principle. In this method, a differential circuit receives a voltage induced in one reception coil (labeled −dIL/dt), and a voltage having a phase inverted by 180° from the induced voltage (labeled −dIL/dt bar), and subtracts −dIL/dt bar from −dIL/dt, thereby canceling in-phase noise as seen in FIG. 9.

The in-phase noise is canceled if there is no delay between −dIL/dt and −dIL/dt bar, However, since the reception signal has a narrow pulse width in principle, as described above, a slight delay caused by variations in elements within the semiconductor, variations in the shape of the coil and the like would result in a failure not only in canceling the in-phase noise but also in correctly capturing the reception signal.

FIG. 10 is an explanatory diagram for describing an example of a failure in receiving a signal due to a slight delay. In the example of FIG. 10, −dIL/dt bar delays as compared with −dIL/dt, resulting in a shift of signals which should be essentially added to each other at the same timing, and in a signal having eight peaks which should essentially have four peaks.

The present invention has been made to solve the problem described above, and its object is to provide a transmission method and an interface circuit excellent in resistance to noise, which are capable of accomplishing a signal transmission without being affected by noise, even if noise is introduced.

It is another object of the present invention to provide a semiconductor device, a printed circuit board, a semiconductor package, a semiconductor module, and a memory module which comprise the interface circuit.

It is a further object of the present invention to provide a portable device which comprises the semiconductor device or printed circuit board.

Means for Solving the Problem

To solve the problem mentioned above, a transmission method of the present invention is characterized in that said transmission coil outputs a magnetic field signal of a triangular or roughly triangular wave by using transmission method to perform a signal transmission in a non-contact manner through an electromagnetic induction.

In a reception coil which receives the magnetic field signal output from the transmission coil, a voltage which is generated by differentiating a reception magnetic field is induced according to the Faraday's electromagnetic induction law.

Conventionally, a transmission coil has transmitted a rectangular digital signal as a magnetic field signal. Therefore, an abrupt impulse waveform having a narrow pulse width is induced in a reception coil through the differentiation processing. Since the waveform is quite similar to introducing noise internally and externally to the semiconductor chip, it is difficult to distinguish a reception signal from the noise.

However, according to the present invention, since the magnetic field signal output from the transmission coil is a triangular wave or a roughly triangular wave, a voltage waveform induced in the reception coil can be shaped into a reception signal of a waveform having a wide pulse width.

As a result, the reception signal can be clearly distinguished from a noise signal which represents a voltage waveform having a narrow width. As such, even if noise is introduced, it is possible to provide a non-contact transmission method which excels in resistance to noise and is not affected by the noise.

In particular, since the pulse width of the reception signal becomes relatively wide, the transmission method of the present invention is suitable for high-speed signal transmission and differential transmission.

According to the transmission method, said triangular wave or said roughly triangular wave is characterized as a waveform which continuously increases or decreases, or a waveform which increases or decreases in steps. Also, in the transmission method of the present invention, a magnetic field signal of a triangular or roughly triangular wave can be output from the transmission coil by devising a signal waveform sent into the transmission coil by a variety of methods in the following manner.

Specifically, in the transmission method of the present invention, (1) the magnetic field signal is generated by providing the transmission coil with a current signal which is shaped through integration processing performed by a transmission circuit connected to the transmission coil, and the integration processing is preferably performed by an RC integration circuit.

Also, according to the transmission method of the present invention, (2) the magnetic field signal is generated by providing the transmission coil with a current signal shaped through current switch processing performed by a transmission circuit connected to the transmission coil, and the current switch processing is preferably performed by a circuit which comprises a plurality of variable current sources and switches connected to the variable current sources, respectively.

In this event, the current signal is preferably smoothed by a smoothing circuit before it is provided to the transmission coil. Since this smoothing circuit smooths the magnetic field signal, the distortion of the voltage waveform induced in the reception coil is mitigated. Thus, effects are produced such as the ability of keep the intensity of the reception signal high and to keep the communication quality high.

Also, the transmission method of the present invention can be in a form wherein two of the transmission coils are provided, and magnetic field signals generated by the respective transmission coils are transmitted with their phases being inverted by 180° from each other.

According to this invention, since the magnetic field signals generated from the transmission coils are transmitted with their phases being inverted by 180° from each other, the transmission/reception of signals between the transmission coils and reception coils forms a differential transmission, thus making it possible to cancel extraneous noise. Further, since the pulse width of the reception signal becomes wider, the reproduction of the waveform of the differential transmission due to a delay is facilitated.

To solve the problem mentioned above, an interface circuit of the present invention is characterized by comprising a transmission circuit for providing a signal to the transmission coil to output a magnetic field signal of a triangular or roughly triangular wave from the transmission coil in an interface circuit for performing a signal transmission through electromagnetic induction.

In the interface circuit of the present invention, the triangular wave or roughly triangular wave is characterized as a waveform which continuously increases or decreases, or a waveform which increases or decreases in steps.

Also, according to the interface circuit of the present invention, (1) the transmission circuit comprises an integration processing circuit for performing the integration processing, and the integration processing circuit is preferably an RC integration circuit. Alternatively, (2) the transmission circuit comprises a current switch processing circuit for performing the current switch processing, and the current switch processing circuit preferably comprises a plurality of variable current sources, and switches connected to the variable current sources, respectively. Also, the transmission circuit preferably comprises a smoothing circuit for smoothing a signal output from the current switch processing circuit.

Also, in the interface circuit of the present invention, two of the transmission coils can be provided in such a form that magnetic field signals generated by the respective transmission coils are transmitted with their phases being inverted by 180° from each other.

To solve the problem mentioned above, a semiconductor device of the present invention is characterized by comprising a transmission coil, and a transmission circuit for providing the transmission coil with a signal to output a magnetic field signal of a triangular or roughly triangular wave from the transmission coil.

In the semiconductor device of the present invention, the triangular wave or roughly triangular wave is characterized as a waveform which continuously increases or decreases, or a waveform which increases or decreases in steps.

Also, in the semiconductor device of the present invention, (1) the transmission circuit comprises an integration processing circuit for performing the integration processing, and the integration processing circuit is preferably an RC integration circuit. Alternatively, (2) the transmission circuit comprises a current switch processing circuit for performing the current switch processing, and the current switch processing circuit preferably comprises a plurality of variable current sources, and switches connected to the variable current sources, respectively. Also, the transmission circuit preferably comprises a smoothing circuit for smoothing a signal output from the current switch processing circuit.

Also, in the semiconductor device of the present invention, two of the transmission coils can be provided in such a form that magnetic field signals generated by the respective transmission coils are transmitted with their phases being inverted by 180° from each other.

Also, in the semiconductor device of the present invention, (A) a semiconductor device having a reception coil may be stacked; (B) a plurality of semiconductor devices each having a reception coil may be stacked; or (C) a plurality of semiconductor devices each having at least the transmission coil are stacked on a semiconductor device having a reception coil.

Also, in the semiconductor device of the present invention, another semiconductor device may be stacked between a semiconductor device, has the transmission coil and the transmission circuit, and a semiconductor device having the reception coil.

To solve the problem mentioned above, a semiconductor package of the present invention is characterized in that the semiconductor device of the present invention set forth above is stacked on a printed circuit board. In this semiconductor package, the semiconductor device and the printed circuit board may be electrically connected through a conductor. Also, the printed circuit board may comprise a reception coil.

To solve the problem mentioned above, a printed circuit board is characterized by comprising a transmission coil, and a transmission circuit for providing a signal to the transmission coil to output a magnetic field signal of a triangular or roughly triangular wave from the transmission coil.

In the printed circuit board of the present invention, the triangular wave or roughly triangular wave is characterized as a waveform which continuously increases or decreases, or a waveform which increases or decreases in steps.

Also, in the printed circuit board of the present invention, (1) the transmission circuit comprises an integration processing circuit for performing the integration processing, and the integration processing circuit is preferably an RC integration circuit. Alternatively, (2) the transmission circuit comprises a current switch processing circuit for performing the current switch processing, and the current switch processing circuit preferably comprises a plurality of variable current sources, and switches connected to the variable current sources, respectively. Also, the transmission circuit preferably comprises a smoothing circuit for smoothing a signal output from the current switch processing circuit.

Also, in the printed circuit board of the present invention, two of the transmission coils can be provided in such a form that magnetic field signals generated by the respective transmission coils are transmitted with their phases being inverted by 180° from each other.

To solve the problem mentioned above, a semiconductor package of the present invention is characterized by comprising a semiconductor device having a reception coil, which is stacked on the printed circuit board of the present invention described above. In this semiconductor package, another semiconductor device may be stacked between the printed circuit board and the semiconductor device, or a plurality of semiconductor devices, each having a reception coil, may be stacked on the printed circuit board.

To solve the problem mentioned above, a semiconductor module of the present invention is characterized in that the semiconductor devices of the present invention set forth above are stacked on a printed circuit board, wherein at least one of the semiconductor devices has a function unit for generating a signal that is different from the magnetic field signal. In this semiconductor module, the semiconductor device and the printed circuit board may be electrically connected through a conductor, and a transmission coil of at least one of the semiconductor devices is disposed at a position which does not oppose a transmission coil of another one of the semiconductor devices.

To solve the problem mentioned above, a memory module of the present invention is characterized in that at least one semiconductor device is used as a memory among the aforementioned "semiconductor device having a transmission coil" or "semiconductor device having a reception coil" of the present invention, or the aforementioned "semiconductor device having a reception coil" of the present invention.

Also, to solve the problem mentioned above, a memory module of the present invention is characterized by comprising a printed circuit board having a reception circuit, and a semiconductor device stacked on the printed circuit board, and by comprising a transmission coil and a transmission circuit for providing a signal to the transmission coil to output a magnetic field signal of a triangular or roughly triangular wave from the transmission coil, where the semiconductor device is used as a memory. In this memory module, the triangular wave or the roughly triangular wave is characterized as a waveform which continuously increases or decreases, or a waveform which increases or decreases in steps, in which case a plurality of the semiconductor devices are preferably stacked.

To solve the problem mentioned above, a portable device of the present invention is characterized by comprising the semiconductor device of the present invention set forth above, or the printed circuit board of the present invention set forth above.

When the interface circuit of the present invention is applied to a semiconductor device, large capacity signal transmission can be enabled between stacked circuit chips by forming multiple transmission/reception coils on the circuit chips which is particularly effective in signal transmissions at high frequencies in a Gigahertz band in which the influence of noise cannot be neglected.

Also, when the interface circuit of the present invention is applied to a semiconductor module, signals can be transmitted not only between an upper and a lower circuit chip which are formed on the printed circuit board directly in contact therewith but also between circuit chips which are vertically stacked thereon which, in particular, results in a semiconductor module which is less susceptible to the influence of noise from intervening circuit chips.

Also, when the interface circuit of the present invention is applied to a memory module, one-to-multiple signal transmissions can be performed between at least one interface chip and a plurality of memory chips, making it possible to realize a large capacity memory module which can operate at high speeds.

Also, when the interface circuit of the present invention is applied to a portable device, it is possible to realize a portable telephone which is less susceptible to the influence of noise within the portable device and is capable of high-speed image processing and communication control.

Effects of the Invention

According to the transmission method and interface circuit of the present invention, since the magnetic field signal output from the transmission coil is shaped into a triangular or roughly triangular wave, a voltage waveform induced in the reception coil can be a reception signal of a waveform having a wide pulse width. As a result, the reception signal can be clearly distinguished from a noise signal which represents a waveform having a narrow width.

It is therefore possible to provide a transmission method and an interface circuit which are not affected by noise, even if noise is introduced, and which excel in resistance to noise. In particular, since the pulse width of the reception signal becomes relatively wide, the transmission method and interface circuit of the present invention are suitable for a high-speed signal transmission and a differential transmission.

Also, the semiconductor device, semiconductor package, printed circuit board, semiconductor module, memory module, and portable device of the present invention, which comprise the transmission method or interface circuit of the present invention, are not affected by noise and hence excel in resistance to noise, and are preferable when high-speed and large-capacity processing are required.

BRIEF DESCRIPTION OF THE INVENTION

Figure 1:
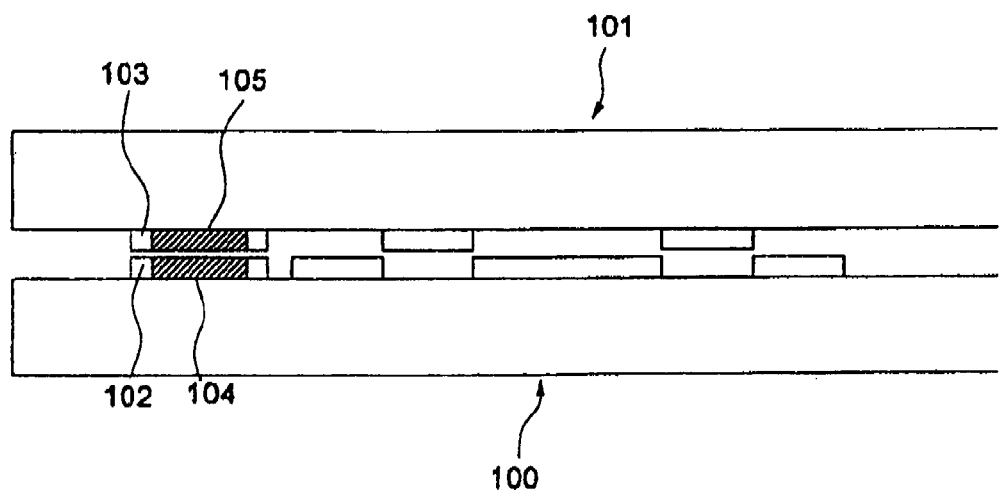
FIG. 1 is a schematic cross-sectional view showing a semiconductor device described in Patent Document 1.
Figure 2:
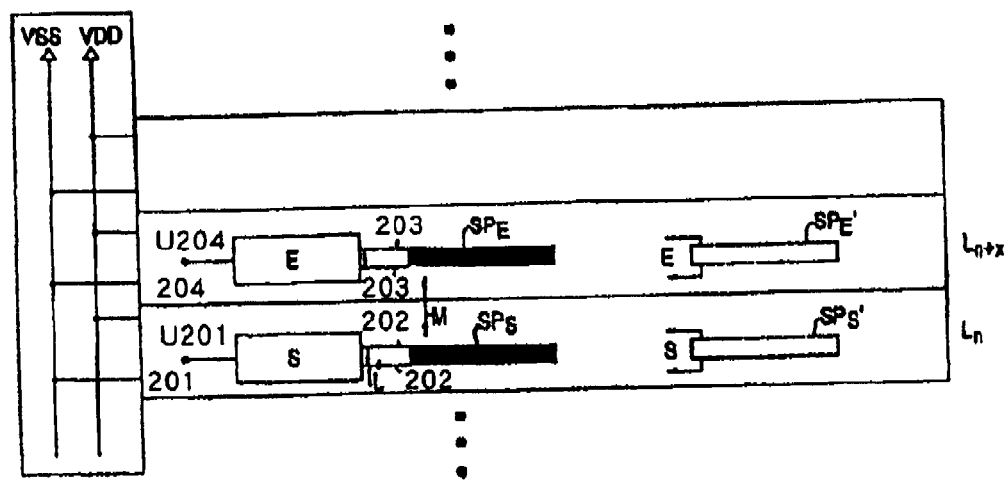
FIG. 2 is a schematic cross-sectional view showing a semiconductor device described in Patent Document 2.
Figure 3:
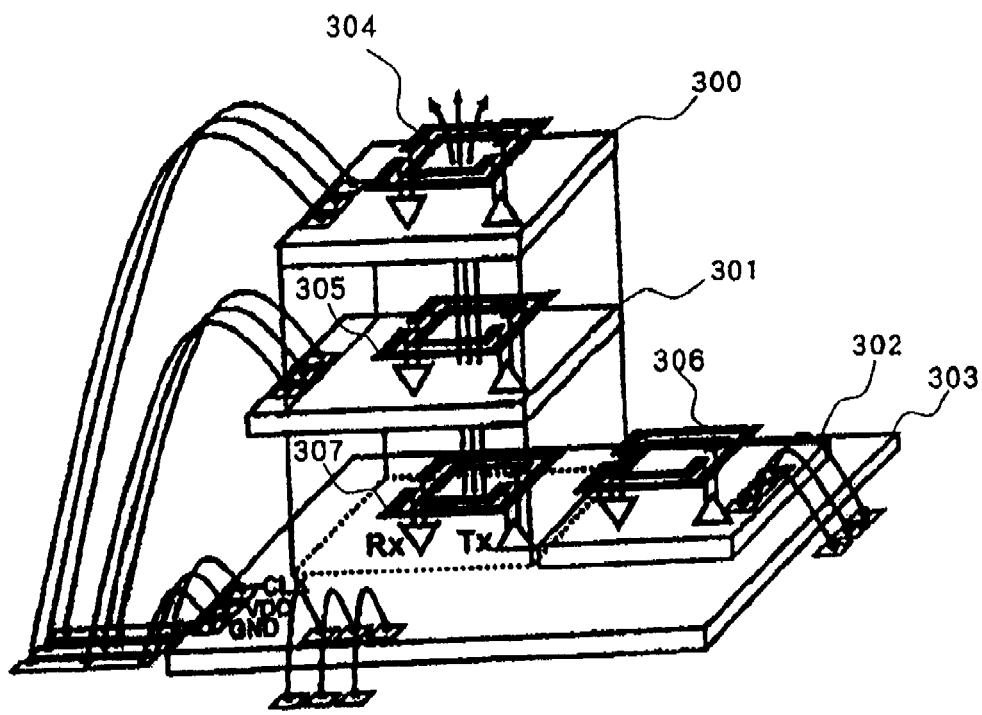
FIG. 3 is a schematic perspective view showing a semiconductor device described in Non-Patent Document 2.
Figure 4:
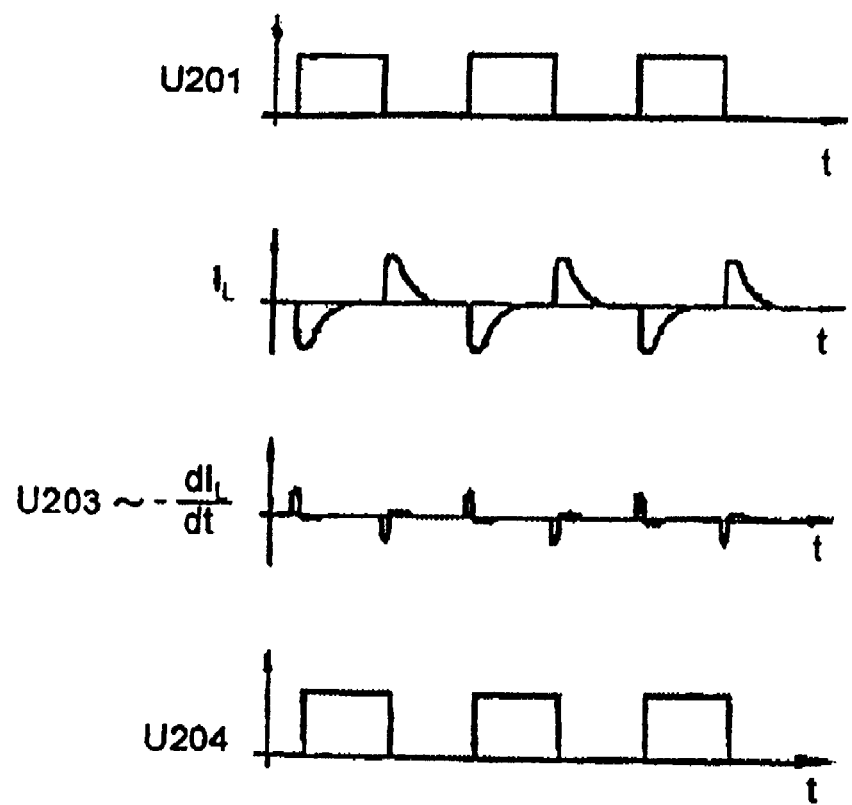
FIG. 4 is a waveform chart showing the waveforms at inputs and outputs of a transmission device, and showing a reception device described in Patent Document 2.
Figure 5:
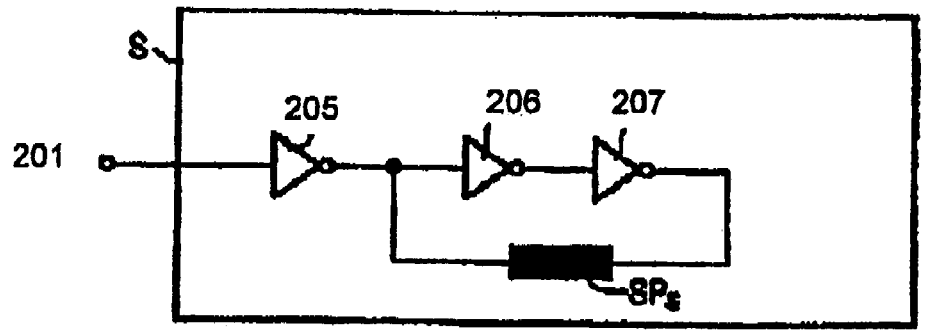
FIG. 5 is a circuit diagram showing a transmission circuit described in Patent Document 2.
Figure 6:
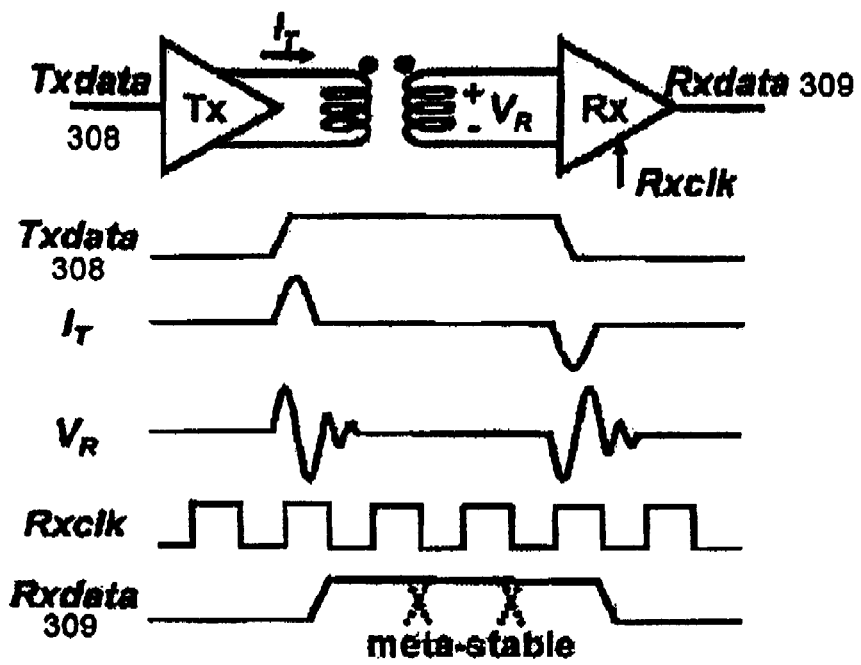
FIG. 6 is a waveform chart showing a transmission/reception circuit described in Non-Patent Document 2, and a current waveform or a voltage waveform at each input/output point thereof.
Figure 7:
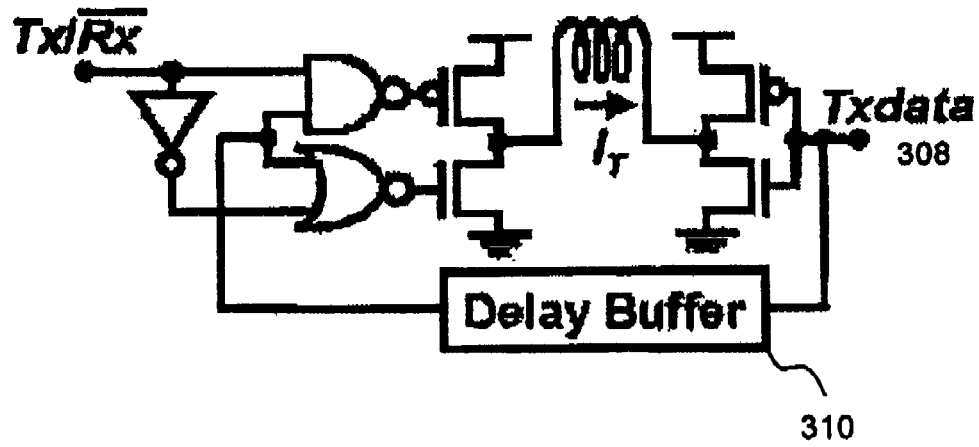
FIG. 7 is a circuit diagram showing a transmission circuit described in Non-Patent Document 2.
Figure 8:
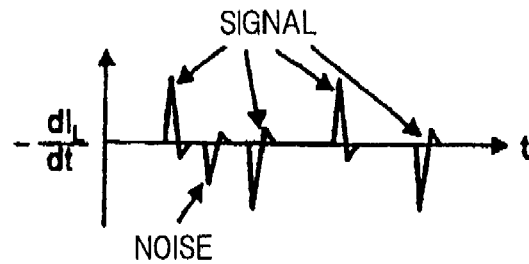
FIG. 8 is a schematic diagram showing the waveform when noise is introduced in a conventional system.
Figure 9:
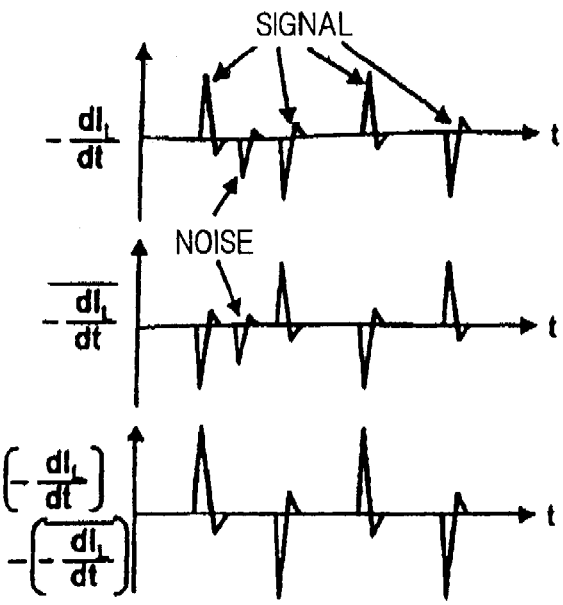
FIG. 9 is a diagram for describing the principle of a differential transmission method for canceling noise.

DESCRIPTION OF REFERENCE NUMERALS 1, 2 Semiconductor Chips
3, 3', 3'', 3''', 3a', 3b' Transmission Circuits 4, 4a, 4b, 4a', 4b', 4a", 4b" Transmission Coils
5, 5a, 5b, 5a', 5b', 5a", 5b" Reception Coils
6, 6', 6", 6'" Reception Circuits
7 Integration Processing Circuit
8, 8a-8e, 8' Variable Current Sources
9 Latch Circuit
10, 10' Integration Processing Circuits
11 Current Switch Processing Circuit
21 Printed Circuit Board
22 Solder ball
S Transmission Device
E Reception Device

BEST MODE FOR CARRYING OUT THE INVENTION

In the following, embodiments of a transmission method, an interface circuit, a semiconductor device, a semiconductor package, a printed circuit board, a semiconductor module, a memory module, and a portable device according to the present invention will be described with reference to the drawings. In the following, each invention will be described in detail, and the description will focus on the interface circuit of the present invention. In this regard, the following embodiments are modes which show examples of the present invention, and should not be construed as being limited to the modes of the description and drawings. In addition, hatching indicative of cross sections is omitted in the cross-sectional view for convenience.

(Interface Circuit)

The interface circuit of the present invention is characterized in that the interface circuit transmits a signal through electromagnetic induction and comprises a transmission circuit for generating a signal which causes a magnetic field signal output from a transmission coil to be a triangular wave or a roughly triangular wave.

As will be described in each of the following embodiments, in this interface circuit, the magnetic field signal output from the transmission coil can be formed into a triangular or roughly triangular wave by manipulating a signal waveform sent from a transmission circuit into the transmission coil by a variety of methods. In this regard, such a magnetic field signal can be generated by applying the transmission coil with a current which has a triangular or roughly triangular wave. Also, for the triangular or roughly triangular wave, for example, a waveform which continuously increases or decreases, or a waveform which gradually increases or decreases is used.

Figure 11:
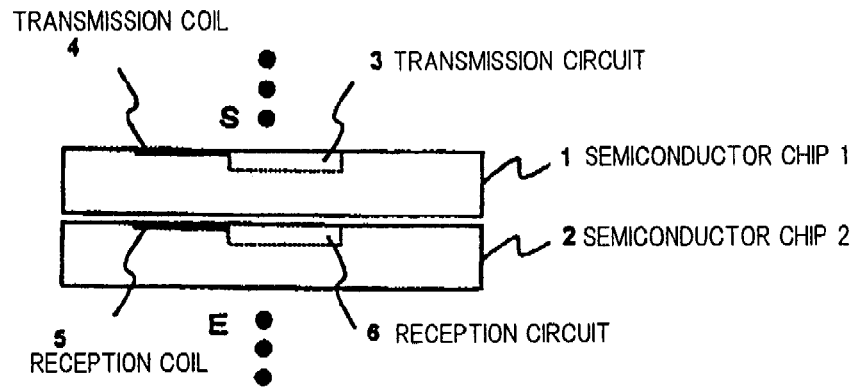
FIG. 11 is a cross-sectional view of a semiconductor device comprising an interface circuit of the present invention.

FIG. 11 is a cross-sectional view of a semiconductor device which comprises the interface circuit of the present invention. In the semiconductor device which comprises the interface circuit, a plurality of semiconductor chips 1 and 2 are stacked, and a signal is transmitted therebetween by transmission coil 4 and reception coil 5.

In the semiconductor device shown in FIG. 11, two semiconductor chips 1 and 2 alone are described, but three or more semiconductor chips may be used by stacking more different semiconductor chips thereabove and therebelow.

Also, while transmission device S (which includes transmission circuit 3 and transmission coil 4, which is applied in the following as well) alone is described in semiconductor chip 1, reception device E (which includes reception circuit 6 and reception coil 5; below is applied in the same) may be formed therein, and semiconductor chip 2 may also be provided with transmission device S (transmission circuit 3 and transmission coil 4). Also, FIG. 11 describes only transmission device S, reception device E, and semiconductor chips 1, 2 in which they are formed, which are minimally required for the interface circuit of the present invention, in an emphasized manner, while omitting hatching indicative of cross sections for convenience.

Transmission circuit 3 and reception circuit 6 are formed by using transistors in each semiconductor chip, and transmission coil 4 and reception coil 5 are formed in a wiring layer of each semiconductor chip.

Preferably, by interposing a non-conductive adhesive layer between respective semiconductor chips 1 and 2 to be stacked, respective semiconductor chips 1 and 2 are adhered to each other.

It should be noted that when respective semiconductor chips 1 and 2 are adhered through a conductive adhesive layer, a magnetic field generated by transmission coil 4 can be interrupted by this adhesive layer and fail to reach reception coil 5 in some cases. By aligning the center axis of transmission coil 4 to the center axis of reception coil 5, reception coil 5 can maximally receive the magnetic field from transmission coil 4.

While one semiconductor chip generally has a thickness of approximately 100 μm, thin semiconductor chips may be employed that have a thickness of approximately 50 μm or even approximately 25 μm. While a semiconductor device has a plurality of such semiconductor chips stacked one on another, its total thickness is generally 1 mm or less. Also, the thickness of the adhesive layer is generally in the order of 25 μm, but may be reduced to approximately 5 μm.

Figure 12:
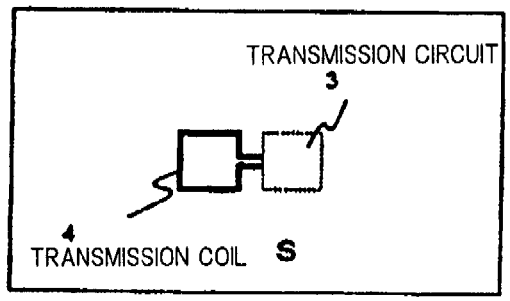
FIG. 12 is a plan view of a semiconductor chip which is formed with a transmission device comprised of a transmission coil and a transmission circuit.

FIG. 12 is a plan view of semiconductor chip 1 which is formed with transmission device S comprised of transmission coil 4 and transmission circuit 3. This transmission device S has one transmission coil 4 connected to one transmission circuit 3. Though not shown, a reception coil and a reception circuit are also disposed on a different semiconductor chip or on the same semiconductor chip in a similar manner. The positional relationship between transmission coil 4 and transmission circuit 3 is not limited to the form shown in FIG. 12, but can be altered as appropriate. It should be noted that, as in embodiments later described, the number of transmission coils 4 contained in transmission device S may be different from the number of transmission circuits 3.

Figure 13:
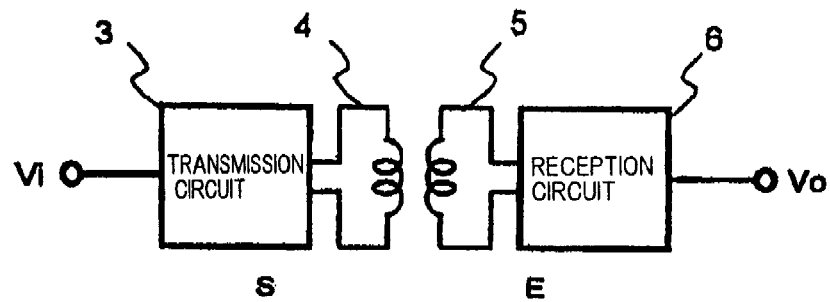
FIG. 13 is a block diagram showing an example of an overall interface circuit which comprises a transmission device and a reception device.

FIG. 13 is a diagram showing an example of a block diagram of the overall interface circuit which comprises transmission device S and reception device E. The interface circuit of the present invention is basically comprised of at least transmission device S which comprises transmission circuit 3 and transmission coil 4, and reception device E which comprises reception coil 5 and reception circuit 6, as shown in FIG. 13. Then, it is characterized in that a magnetic field signal output from transmission coil 4 presents a triangular wave or a roughly triangular wave. The magnetic field signal output from the transmission coil 4 is received by reception coil 5, and differentiated by reception circuit 6 to be shaped into a rectangular wave.

In the interface circuit of the present invention, the magnetic field signal may be generated by applying the transmission coil with a current signal of a triangular or roughly triangular wave shaped through integration processing in transmission circuit 3 connected to transmission coil 4, or (2) may be generated by applying the transmission coil with a current signal of a triangular or roughly triangular wave shaped through current switch processing in transmission circuit 3 connected to transmission coil 4.

(Shaping Through Integration Processing)

First a description will be given of an example in which a current signal of a triangular or roughly triangular wave is generated through integration processing in transmission circuit 3 connected to transmission coil 4, and the current signal is applied to transmission coil 4 to generate a magnetic field signal of a triangular or roughly triangular wave.

Figure 14:
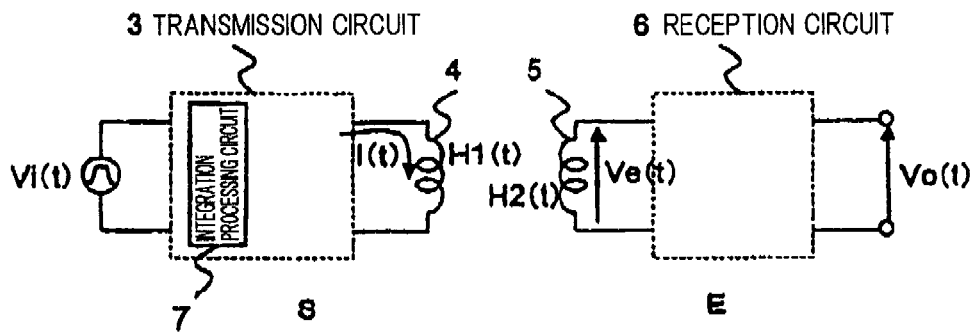
FIG. 14 is a circuit diagram generally showing an exemplary interface circuit of the present invention.

FIG. 14 is a circuit diagram generally showing an example of the interface circuit according to the present invention. In this embodiment, transmission circuit 3 comprises integration processing circuit 7, and integration processing circuit 7 shapes input waveform Vi(t) of transmission circuit 3 into current I(t) of a triangular or roughly triangular wave.

Figure 15:
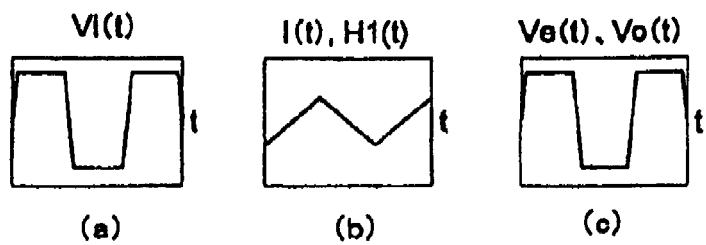
FIG. 15 is a waveform chart showing an example of an input waveform of the transmission circuit shown in FIG. 14, a current waveform applied to the transmission coil, a magnetic field waveform generated from the transmission coil, an induced voltage in a reception coil, and an output signal of the reception circuit.

FIG. 15 is a diagram showing an example of input waveform Vi(t) of transmission circuit 3; current waveform I(t) applied to transmission coil 4; magnetic field waveform H1(t) generated from transmission coil 4; induced voltage Ve(t) in reception coil 5; and output signal Vo(t) of reception circuit 6.

In transmission circuit 3 which comprises integration processing circuit 7, integration processing circuit 7 shapes data signal Vi(t) (see FIG. 15(a)) of a rectangular wave applied to transmission circuit 3 into current waveform I(t) (see FIG. 15(b)) of a triangular or roughly triangular wave, and this current waveform I(t) is applied to transmission coil 4.

Magnetic field H1(t) (see FIG. 15(b)) generated from transmission coil 4 presents the same waveform as current waveform I(t). When magnetic field H1(t) reaches reception coil 5, induced voltage Ve(t) is generated in reception coil 5.

Induced voltage Ve(t) is a differentiated waveform of I(t) or H1(t) of a triangular or roughly triangular wave. Since I(t) or H1(t) indicates such a waveform which is produced by integrating a rectangular wave by transmission circuit 3, its differentiated waveform indicates a rectangular wave having a wide pulse width (see FIG. 15(c)) similar to the input waveform, as a result.

Figure 16:
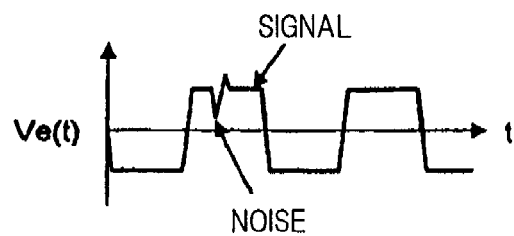
FIG. 16 is a waveform chart showing the waveform of an induced voltage in the reception coil when the reception coil simultaneously receives a signal and noise.

FIG. 16 is a diagram showing the waveform of induced voltage Ve(t) in reception coil 5 when reception coil 5 simultaneously receives a signal and noise. With a signal having a pulse width sufficiently long as compared with the width of the noise, it is easy to separate the signal and noise, and as a result, an interface circuit that has excellent in noise resistance characteristics can be realized.

Figure 17:
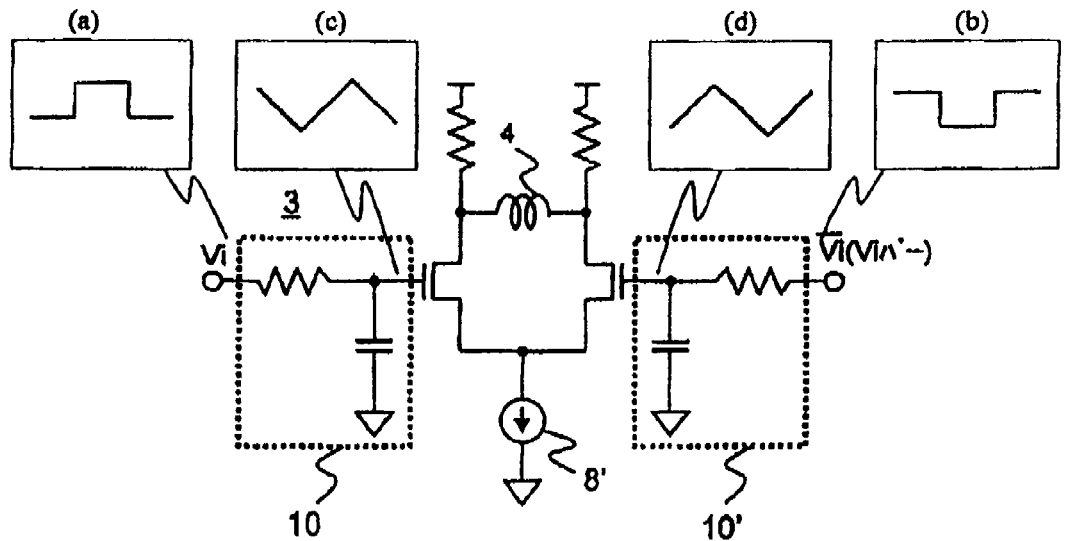
FIG. 17 is a circuit diagram showing an exemplary transmission circuit which comprises an integration processing circuit.

FIG. 17 is a circuit diagram showing part of transmission circuit 3 which comprises the integration processing circuit. This transmission circuit 3, without using a variable current source, integrates data signal Vi applied to transmission circuit 3 with RC integration circuit (low pass filter) made up of resistor R and capacitance C, and applies the integrated signal to transmission coil 4. Reference numerals 10 and 10' in FIG. 17 are given to integration processing circuits which comprises an RC integration circuit (low pass filter).

When a signal applied to input terminal Vi or Vi bar is a rectangular wave as shown in (a), (b) in FIG. 17, the output of the RC circuit (i.e., a gate input to a differential pair of transistors comprised of two NMOS connected to both ends of transmission coil 4 of transmission circuit 3) becomes a triangular wave, as shown in (c), (d) in FIG. 17, by virtue of the effect of the low pass filter of the RC circuit. As a result, the transmission coil 4 can be applied with a triangular current waveform rather than a rectangular wave.

In this regard, when an RC circuit is used as an integration processing circuit, transmission data is preferably data which repeats 1 and 0 as a clock signal. The reason for this is that as a clock signal passes through an RC circuit, the resulting signal is a triangular wave which always vibrates between amplitudes of the same current values.

However, according to the method of creating a triangular wave that uses an RC integration circuit of this embodiment shown in FIG. 17, it is necessary to appropriately select a low pass filter coefficient for the RC circuit and a symbol rate for the transmission data.

For example, when the cut-off frequency of the RC circuit is equal to the symbol rate of the transmission data indicative of one symbol width, data of single bit equal to the symbol rate is clearly output as a triangular wave. However, when the cut-off frequency of the RC circuit is higher than the symbol rate, the output of the RC integration circuit can fail to be a complete triangular wave and may possibly have a slight rectangular portion left therein. When a slight rectangular portion is left in this way, a spike-like transmission wave can result as before when the data is transmitted using a transmission/reception coil.

Therefore, according to the integration processing using the RC circuit as shown in FIG. 17, the filter coefficient of the RC circuit is preferably increased by changing the resistance of R and the capacitance of C, resulting in the cut-off frequency of the RC circuit falling to the symbol rate or less of the transmitted signal.

Next, a description will be given of an example in which a transmitted signal is a data sequence of 0 or 1 which does not have a certain regularity, and in which a maximum number of continuous 0's or 1's is unknown, and in which a current flowing through transmission coil 4 is controlled with the intention of shaping a triangular wave such that the current begins to flow at a data signal start time and the current stops at a data signal end time, like the integration circuit that utilizes the RC circuit shown in FIG. 17.

Figure 18:
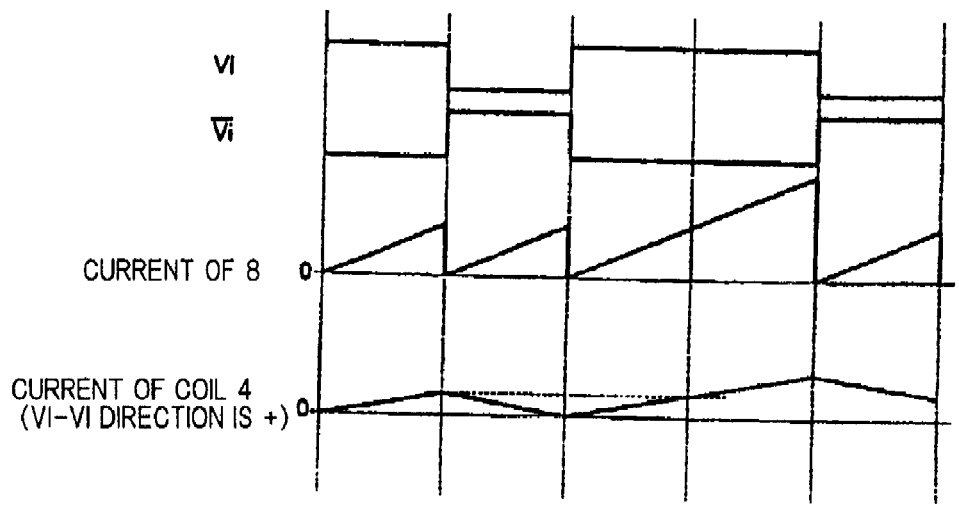
FIG. 18 is a timing chart showing an example when data is to be transmitted is random.

FIG. 18 shows a timing chart when transmitted data is a data sequence of 0 and 1 which does not have a certain regularity.

When transmission device S creates a current having triangular wave in order that reception device E can acquire a data signal of a rectangular wave, for a data signal sequence in which 0's or 1's continue, a current flowing into transmission coil 4 must be continuously increased or decreased while the data signal of 0's or 1's continues. In addition, since the data signals (Vi and Vi bar) applied to transmission circuit 3 are not regular, a problem arises in that the number of continuing 0's or 1's of the data signal cannot be forecasted, so that an upper limit cannot be established for the current applied to transmission coil 4. When a current is controlled using a semiconductor electronic circuit as in this application, the shaping of the triangular wave cannot be conducted through current control because the current cannot be infinitely increased or decreased in a continuous manner.

However, when transmitted data is not random data, and the number of continuing 0's or 1's can be previously forecasted, the data can be transmitted by controlling a current to flow at a data start time and stop at a data end time.

For example, with the use of a 8B10B encoding circuit shown in the aforementioned Non-Patent Document 3, a triangular wave can be transmitted by a current control to continuously increase or decrease the current during a data start time and end time as in this embodiment. In this regard, the 8B10B encoding circuit is an encoding circuit for adding two bits to 8-bit data to transmit 10-bit data, and can reduce the number of continuing 0's or 1's of data to five or less.

Next, a description will be given of another aspect of shaping through integration processing. Integration processing can also be performed by an integration circuit using a charge pump, an operational amplifier, a switched capacitor or the like. A current signal of a triangular or roughly triangular wave can also be shaped by a variety of such integration processing circuits, and the current signal can be applied to the transmission coil to generate a magnetic field signal of a triangular or roughly triangular wave.

(Shaping Through Current Switch Processing)

Next, a description will be given of an example in which a transmission circuit connected to a transmission coil shapes a current signal of a triangular or roughly triangular wave through current switch processing, and the current signal is applied to the transmission coil to generate a magnetic field signal of a triangular or roughly triangular wave.

Figure 19:
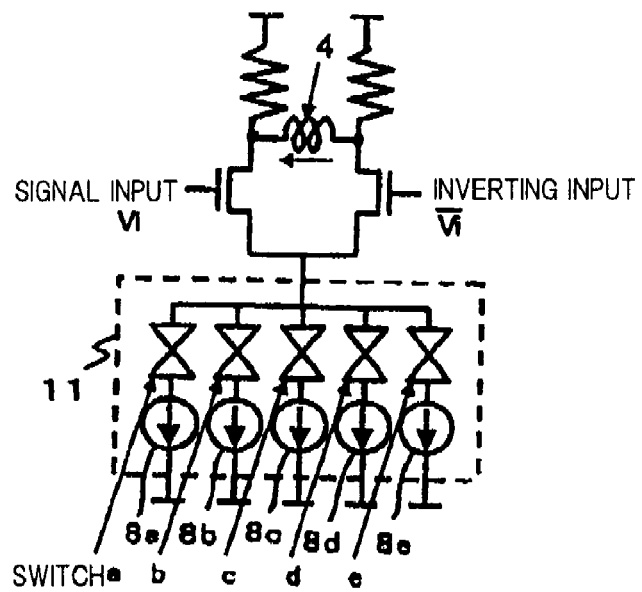
FIG. 19 is a circuit diagram showing an exemplary transmission circuit which comprises a current switch processing circuit.
Figure 20:
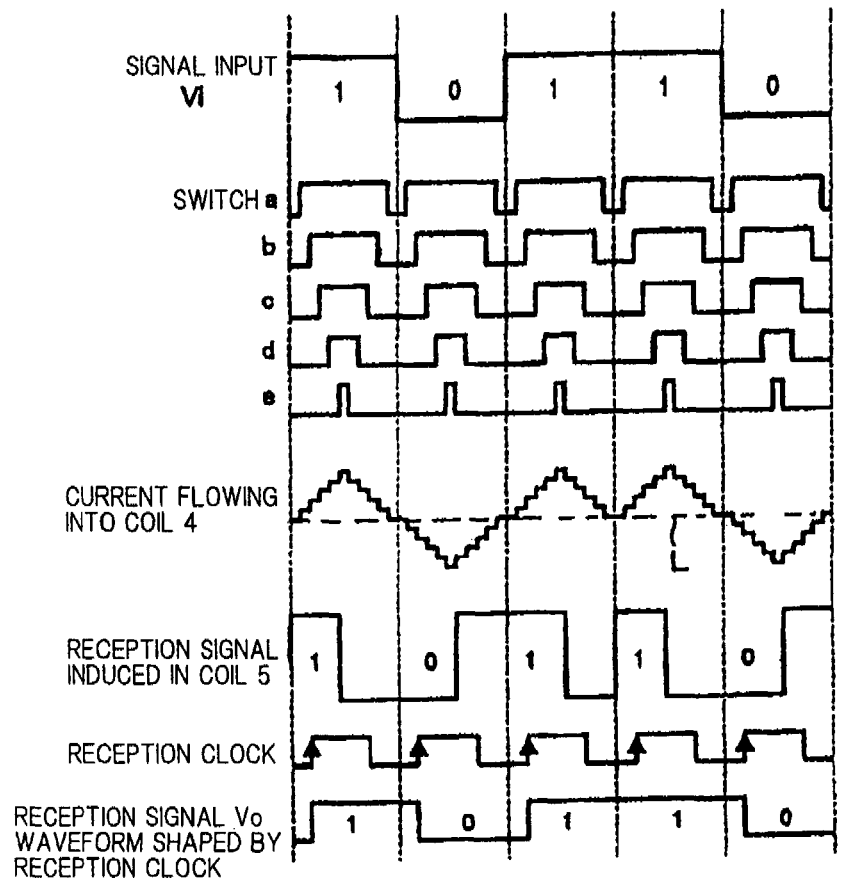
FIG. 20 is a timing chart showing an example when a triangular wave is applied to a transmission coil of the transmission circuit shown in FIG. 19.

FIG. 19 is a circuit diagram showing an exemplary transmission circuit which comprises a current switch processing circuit, and FIG. 20 is an example of a timing chart for describing the operation for applying a triangular wave to a transmission coil of the transmission circuit shown in FIG. 19.

This transmission circuit comprises current switch processing circuit 11, and current switch processing circuit 11 comprises a plurality of variable current sources 8a-8e, and switches a-e connected to respective variable current sources 8a-8e. The shaping of rectangular data signal Vi, which is applied to the transmission circuit, into a current of a triangular or roughly triangular wave can be conducted by controlling opening and closing times of switches a-e. Unless otherwise noted, the triangular or roughly triangular wave is abbreviated as "triangular wave" in the following.

A description will be given of a method of applying a triangular wave to transmission circuit 4 when data signal Vi, which includes continuing 0's or 1's with an arbitrary number of the continuing 0's or 1's is used as an input signal to the transmission circuit, using the timing chart of FIG. 20. In this example, the same current flows through all variable current sources 8a-8e connected to respective switches a-e.

First, switch a-e included in each variable current source 8a-8e is changed to synchronize with a switching timing of data signal Vi. For example, as shown in FIG. 20, switch a is closed for a time period from the center of a data width to 90% of the data width from the beginning to the end of data signal Vi; switch b is closed for a time period from the center of the data width to 70% of the data width; switch c is closed for 50% of the data width in a similar manner; switch d is closed for 30% of the data width in a similar manner; and switch e is closed for 10% of the data width in a similar manner.

While the respective switches are closed, currents of variable current sources 8a-8e disposed in series to the closed switches flow into transmission coil 4, so that the amount of current flowing into transmission coil 4 can be controlled in accordance with the number of closed switches.

In the example shown in FIG. 20, for example, the absolute value of the amount of current flowing into transmission coil 4 reaches a maximum at the center of the data width of data signal Vi, and reaches a minimum at the beginning and end of data signal Vi. Specifically, when data signal Vi applied to the transmission circuit is 1, a change in the current flowing into transmission coil 4 turns to decrease after an increase, whereas when data signal Vi is 0, a change in the current flowing into transmission coil 4 turns to increase after a decrease. Then, upon switching of data signal Vi, it is reset to a fixed value (line L in FIG. 20) without fail. By using the transmission circuit as shown in FIG. 19, the current flowing into transmission coil 4 is reset to zero without fail upon the switching of data signal Vi. When data signal Vi is 1, the current returns to zero after it has positively increased, where the current flowing in a direction of the arrow through transmission coil 4 in FIG. 19 is positive. Conversely, when data signal Vi is 0, the current flowing into transmission coil 4 returns to zero after it has negatively increased.

As the thus shaped triangular-wave current flows through transmission coil 4, the transmission coil outputs a triangular wave magnetic field signal. This triangular-wave magnetic field signal is induced in the reception coil, and the induced voltage waveform appears as the waveform of the differentiated triangular-wave magnetic field signal output from the transmission coil (i.e., substantially the same as the triangular wave which flowed into transmission coil 4).

Accordingly, when the current flowing through transmission coil 4 increases upward toward the right at a fixed inclination as shown in FIG. 20, a voltage of "1" is induced in the reception coil as its differentiated value, whereas when the current flowing through transmission coil 4 decreases downward toward the right at a fixed inclination, a voltage of "0" is induced in the reception coil as its differentiated value.

Specifically, data signal Vi that is provided to the transmission circuit is 1, the voltage induced in the reception coil is 1 in the former half of the data width of this data signal Vi, and is 0 in the latter half. Conversely, when data signal Vi that is provided to the transmission circuit is 0, the voltage induced in the reception coil is 0 in the former half of the data width of this data signal Vi, and is 1 in the latter half, resulting in a rectangular wave having a wide pulse width.

The interface circuit of the present invention can determine transmitted data by determining a former half portion of an induced voltage change by using a clock signal of the receiving apparatus for the thus received reception signal.

Figure 21:
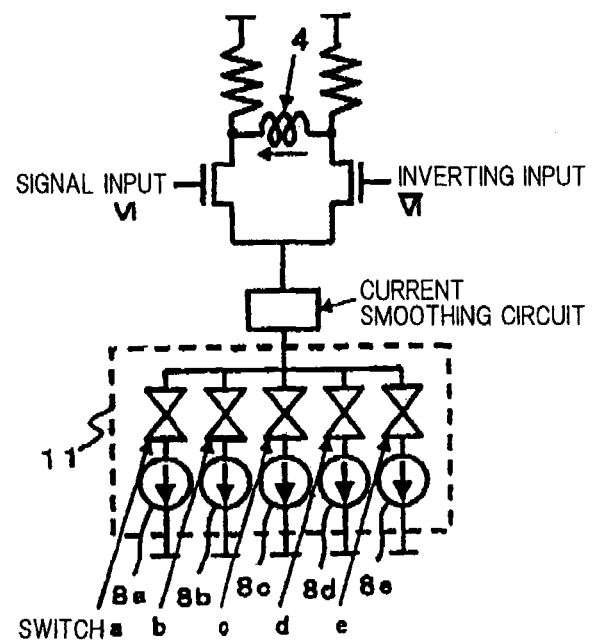
FIG. 21 is a circuit diagram showing another exemplary transmission circuit which comprises a current switch processing circuit.

FIG. 21 is a circuit diagram showing another exemplary transmission circuit which comprises a current switch processing circuit. Specifically, FIG. 21 is a circuit diagram showing an example in which a current smoothing circuit is connected between current switch processing circuit 11 within the transmission circuit shown in FIG. 19, and a differential semiconductor device for applying a signal to the transmission circuit.

Figure 22:
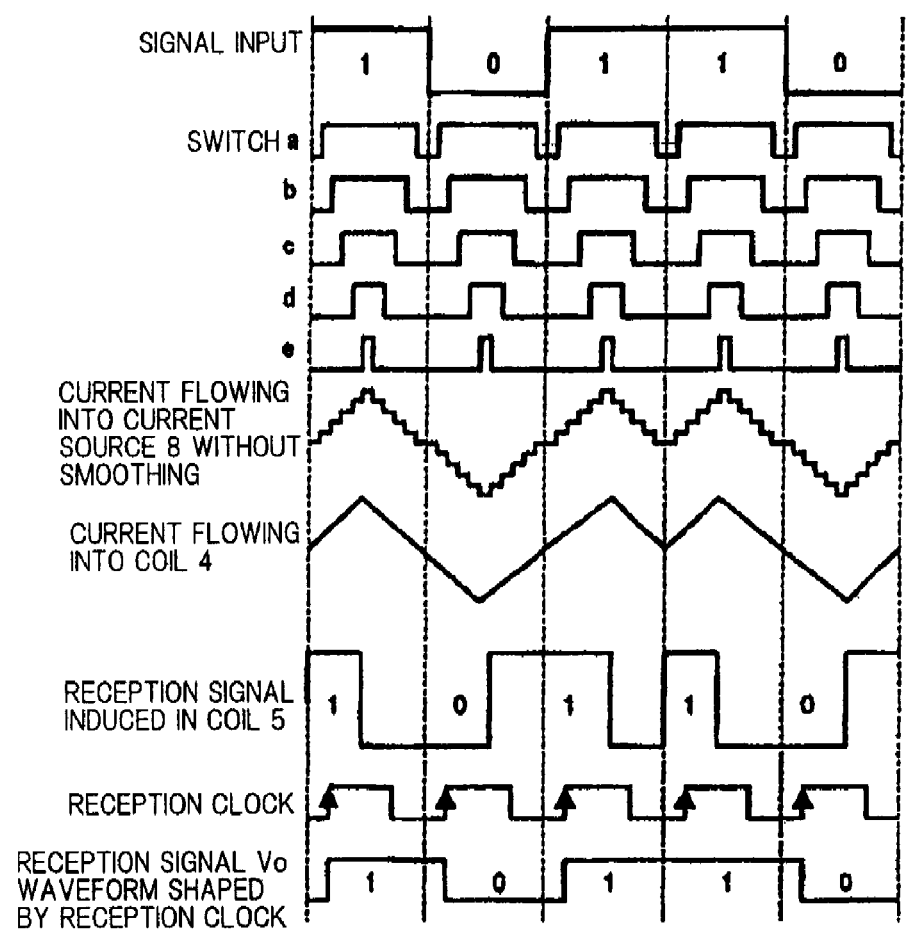
FIG. 22 is a timing chart for applying a triangular wave to the transmission coil of the transmission circuit shown in FIG. 21.

FIG. 22 is a timing chart for describing the operation for providing a triangular wave to a transmission coil of the transmission circuit shown in FIG. 21.

As shown in FIG. 20, when a current signal of triangular wave is shaped by switching a plurality of switches a-e, step-shaped discontinued portions can occur corresponding to switching timings of switches a-e. When a current signal of triangular wave has step-shaped discontinued portions, the waveform of a voltage induced in the reception coil distorts, resulting in a reception signal having a lower intensity, and a lower communication quality.

Accordingly, in the transmission circuit shown in FIG. 21, the step-shaped discontinued portions are smoothed by a current smoothing circuit inserted between current switch processing circuit 11 and transmission differential pair transistors which are differential semiconductor devices. As a result, distortions of the voltage waveform induced in the reception coil are mitigated, thus making it possible to keep the strength of the reception signal high and keep the communication quality high.

Figure 23:
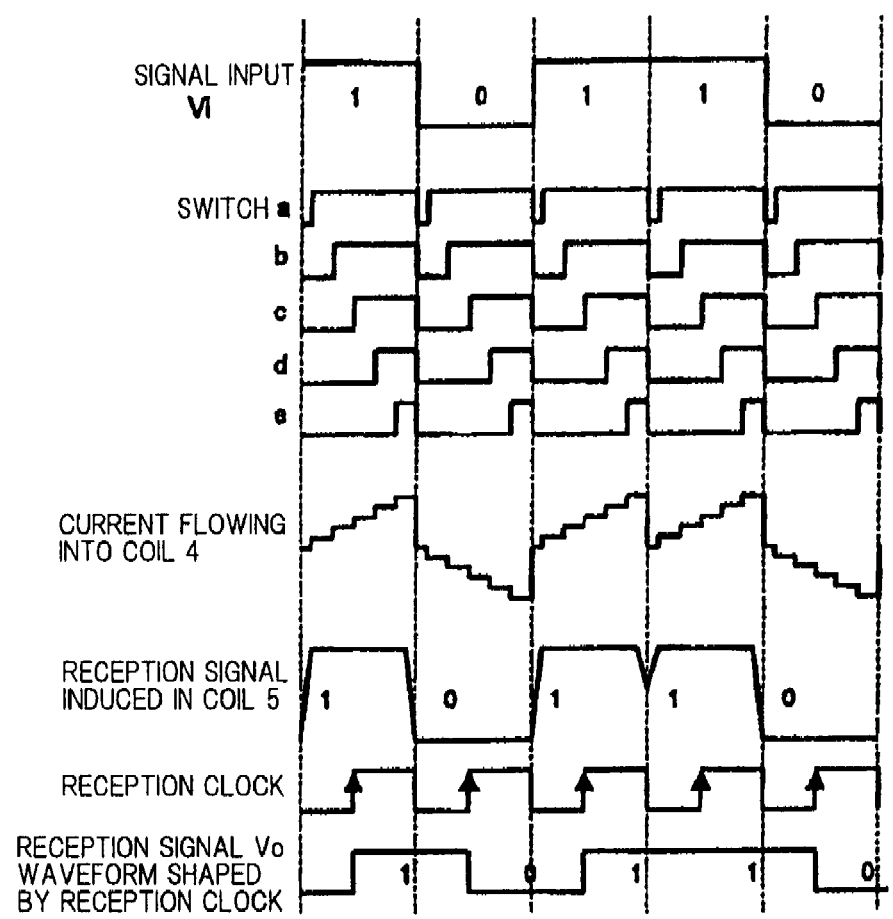
FIG. 23 is a timing chart showing another example when a triangular wave is applied to the transmission coil of the transmission circuit shown in FIG. 19.

FIG. 23 is another example of a timing chart for describing the operation for providing a triangular wave to the transmission coil of the transmission circuit shown in FIG. 19.

Similar to the foregoing, the example of FIG. 23 also employs five switches a-e and variable current sources 8a-8e for applying a current of a triangular wave to transmission coil 4, and switches a-e are controlled in steps, thereby causing a current flowing through the transmission coil during a duration of a data width to continuously increase upward toward the right or downward toward the right. It should be noted that in this example, the same current also flows into each variable current source.

As shown in FIG. 23, switch a opens after a time that is equivalent to 10% of the data width has passed from the start time of data signal Vi, and closes at the end of data signal Vi.

Likewise, switch b opens after a time that is equivalent to 30% of the data width has passed ; switch c opens after a time that is equivalent to 50% of the data width has passed; switch d opens after a time that is equivalent to 70% of the data width has passed; and switch e opens after a time that is equivalent to 90% of the data width has passed, and all switches a-e simultaneously close at the end of data signal Vi.

By thus controlling the plurality of switches, a saw tooth shaped current, which is a roughly triangular wave, can be applied to transmission coil 4. When such a saw tooth shaped current flows into transmission coil 4, a reception signal induced in the reception coil appears to be a rectangular wave substantially in the same shape as data signal Vi applied to the transmission circuit. However, with data signal Vi which includes 1's or 0's in succession glitches, glitch can appear at every data width in the reception signal, in which case data signal Vi can be correctly received if the waveform of the reception signal is shaped using a reception clock near the center of the received signal data, even if glitch occurs in a reception signal which includes continuing 1's or 0's.

Figure 24:
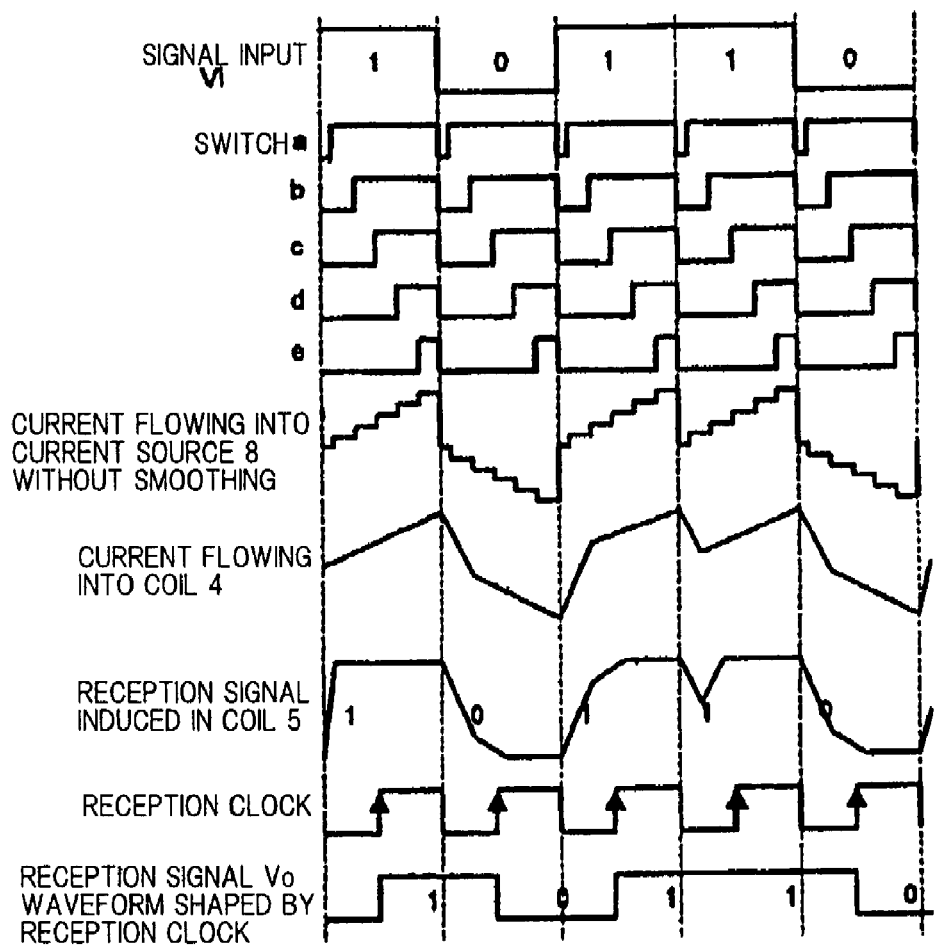
FIG. 24 is a timing chart showing an example when a step-like current generated in the timing chart of FIG. 23 is smoothed by the transmission circuit shown in FIG. 21.

FIG. 24 is an example of a timing chart for describing the operation when the step-shaped current generated in the timing chart of FIG. 23 is smoothed by the transmission circuit shown in FIG. 21. As shown in FIG. 23, when a saw tooth shaped current, which is a roughly triangular wave, is shaped by switching a plurality of switches a-e, step-shaped discontinued portions can occur corresponding to switching timings of switches a-e.

When a saw tooth shaped current has a step-shaped discontinued portion, the waveform of a voltage induced in the reception coil becomes distorted, resulting in a reception signal having a lower intensity, and a lower communication quality. Accordingly, in the transmission circuit shown in FIG. 21, the step-shaped discontinued portions are smoothed by a current smoothing circuit inserted between current switch processing circuit 11 and transmission differential pair transistors which are differential semiconductor devices. As a result, distortions of the voltage waveform induced in the reception coil are mitigated, thus making it possible to keep the strength of the reception signal high and keep the communication quality high.

As described above using the timing charts of FIGS. 20, 22, 23 and 24, by shaping a current flowing into transmission coil 4 into a triangular wave or a saw tooth shaped wave (waveform comparable to a roughly triangular wave), a voltage induced in the reception coil can be transformed into a rectangular wave having a wide data width.

Figure 25:
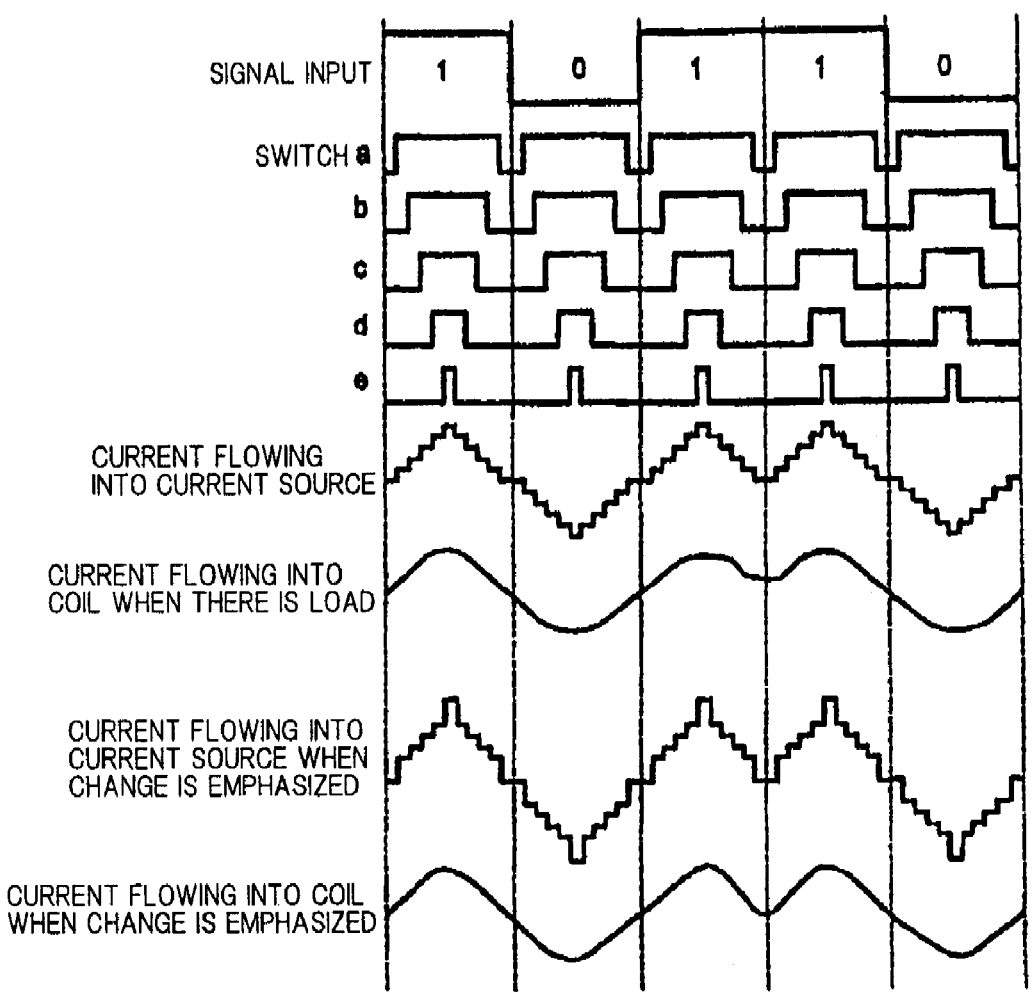
FIG. 25 is a timing chart of an example when a current waveform of a triangular wave is emphasized.
Figure 26:
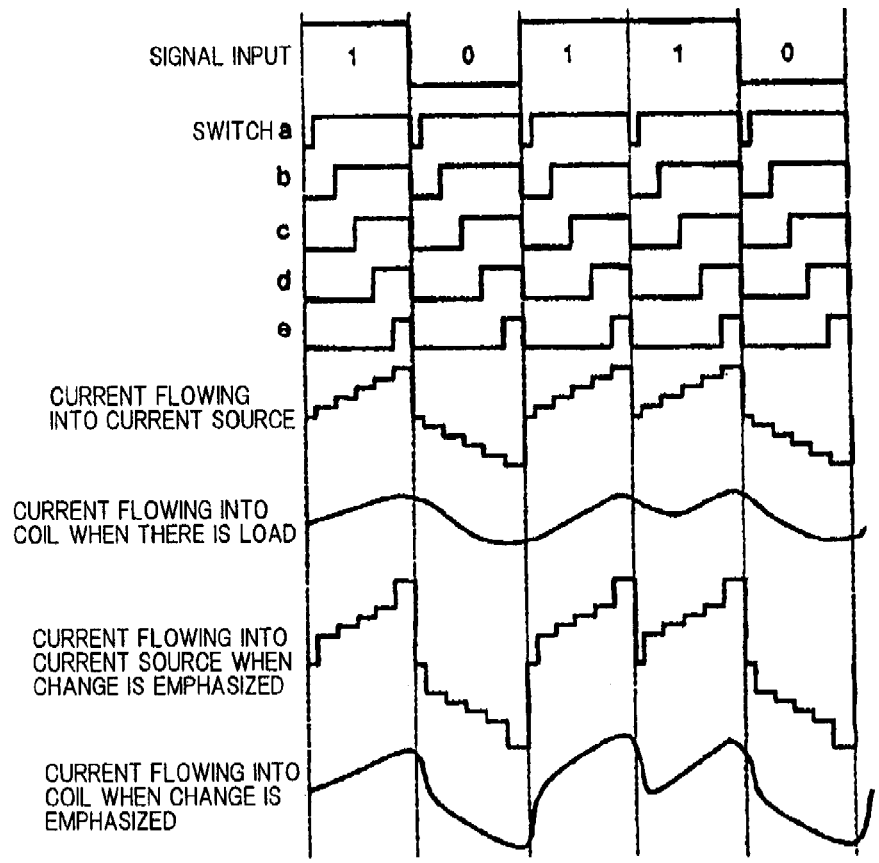
FIG. 26 is a timing chart of an example when a current waveform of a saw tooth wave is emphasized.

On the other hand, since parasitic components (loads) of active elements such as resistive elements, transmission coil, differential transistor pair, switch elements, current sources and the like, and parasitic capacitance of passive elements and the like exist within the transmission circuit, a current flowing into transmission coil 4 can gently slope due to the parasitic components and fail to be a clearly triangular wave or saw tooth shaped wave (roughly triangular wave), as shown in FIGS. 25 and 26.

In such a case, the waveform of the voltage induced in the reception coil becomes distorted to reduce the intensity of the reception signal, resulting in a lower communication quality.

Thus, the current waveform applied into transmission coil 4 is preferably changed such that a triangular wave or saw tooth wave is emphasized, for this purpose, the amount of current of variable current sources 8a and 8b connected to switch a and switch e shown in FIG. 19 or 21, for example, are set larger than the amount of current sources connected to other switches.

By doing so, when the total sum of currents flowing into all current sources change from increase to decrease or from decrease to increase, the change in the total amount of current can be emphasized. Specifically, the current waveform of the triangular wave can be emphasized as shown in FIG. 25, or the current waveform of the saw tooth shaped wave can be emphasized as shown in FIG. 26. As a result, it is possible to restrain the current flowing into transmission coil 4 from obtunding, and maintain the communication quality while keeping the intensity of the reception signal.

In the foregoing manner, the magnetic field signal output from the transmission coil is shaped into a triangular or roughly triangular wave by applying the transmission coil with a triangular or roughly triangular wave rather than a rectangular wave, with the result that the voltage waveform induced in the reception coil, i.e., the reception signal applied to the reception circuit, can have a wide pulse width to accomplish signal transmissions which excel in resistance to noise.

(Differential Transmission)

Next, a description will be given of a differential transmission which excels noise resistance characteristics. In the present invention, a differential transmission involves generating magnetic field signals, the phases of which are inverted by 180°, from each other, from two transmission coils, and inducing reception voltages from the magnetic field signals in reception coils, thereby making it possible to cancel noise which is introduced into a signal having a wide pulse width.

Figure 27:
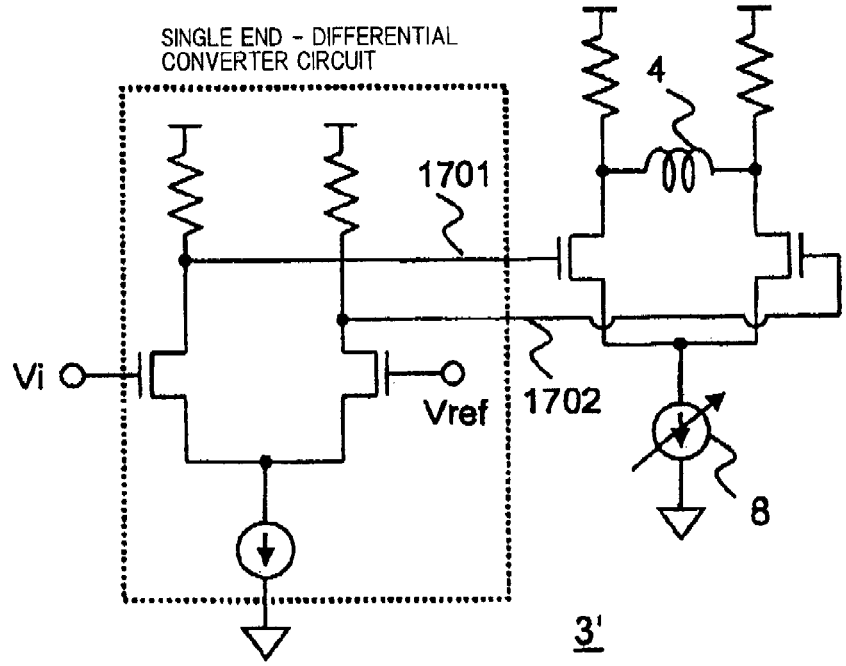
FIG. 27 is a circuit diagram showing an exemplary transmission circuit which comprises a differential circuit.

Prior to describing a coil implementation and circuit implementation which can cancel noise through the differential transmission, a basic differential circuit will be described. FIG. 27 is a circuit diagram showing an exemplary transmission circuit which comprises a basic differential circuit. Transmission circuit 3 shown in FIG. 27 comprises a single end-differential converter circuit for converting data signal Vi(t) which is a single end signal to a differential signal, and variable current source 8 for integrating data signal Vi(t).

Figure 28:
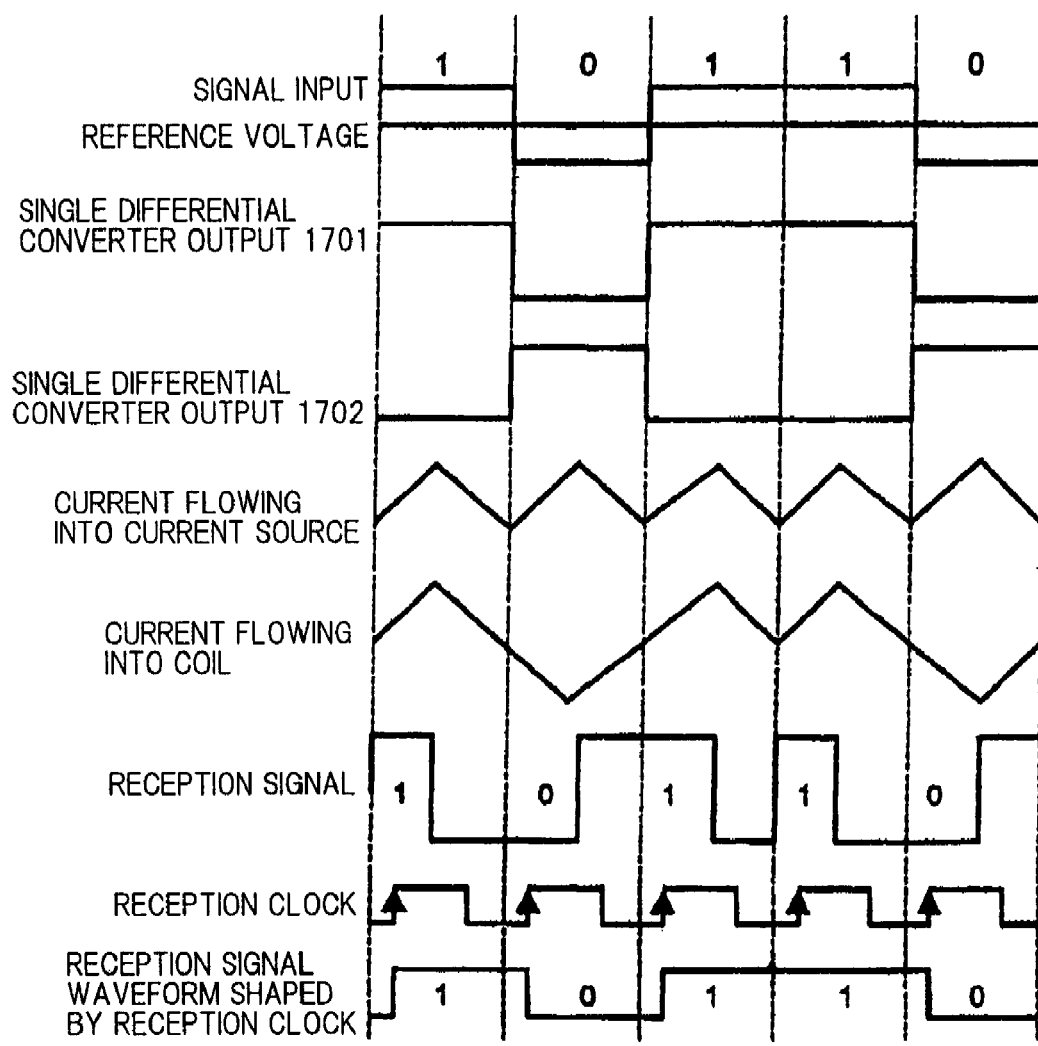
FIG. 28 is a timing chart showing an exemplary operation of the transmission circuit shown in FIG. 27.

FIG. 28 is a timing chart showing the operation of the transmission circuit shown in FIG. 27. The single end-differential converter circuit is applied with signal Vi at one of two input terminals and with reference voltage Vref at the other input terminal. Reference voltage Vref is set at an intermediate value between a high level and a low level of signal input Vi, such that differential outputs 1701 and 1702 are output from the single end-differential converter circuit. Variable current source 8, which forms part of an output circuit, generates a triangular-wave current which changes from a minimum value, reaches a maximum value, and again returns to the minimum value, from a current flowing into the current source, in accordance with the symbol rate of input signal Vi. As a result, a current flowing into a coil is shaped into a triangular wave as shown in the timing chart. In this regard, the symbol rate refers to the width of one symbol in transmission data, as previously stated.

Figure 29:
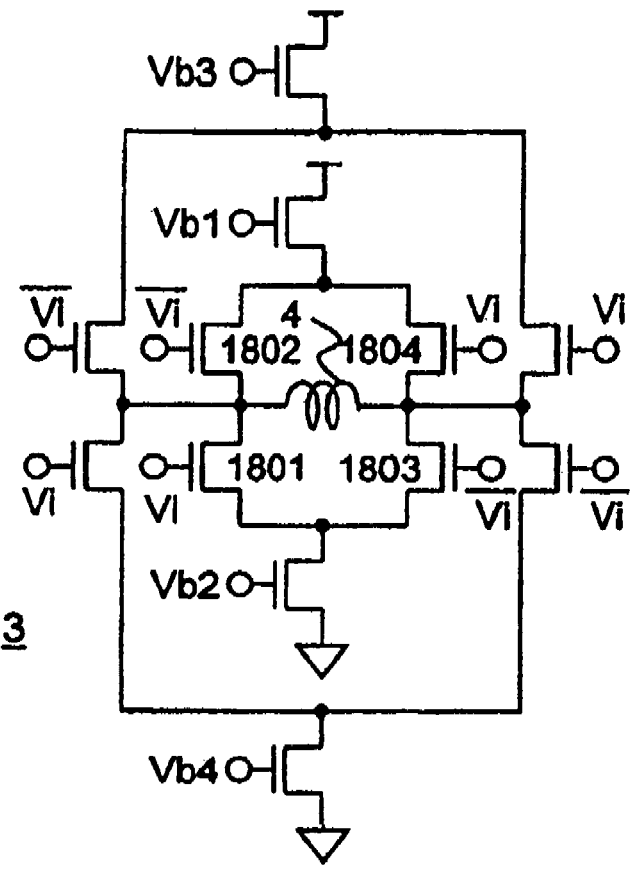
FIG. 29 is a circuit diagram showing an exemplary transmission circuit which comprises another differential circuit.

FIG. 29 is a circuit diagram showing an exemplary transmission circuit which comprises another differential circuit. In transmission circuit 3 shown in FIG. 29, two differential circuits are connected for inverting two Vi(t) and two Vi(t) bars at the top, bottom, left and right of transmission coil 4 and applying the resulting signals to transmission coil 4.

Transmission circuit 3 can shape the current waveform of a triangular or roughly triangular wave by controlling the values of a pair of biases Vb1, Vb2 and the values of a pair of biases Vb3, Vb4 of each differential circuit. Also, transmission circuit 3 shown in FIG. 29 can be operated in a similar manner to the previously shown current switch processing circuit by replacing switch a of variable current source 8a shown in FIG. 19 or 21 with the pair of Vb1 and Vb2, and by replacing switch b of variable current source 8b with the pair of Vb3 and Vb4, and by increasing the number of such differential circuits.

The basic operation is similar to the timing chart (see FIG. 20) of the transmission circuit in FIG. 19. The role of a switch comparable to switch a in FIG. 19 is played by two transistors Vb1 and Vb2 in FIG. 29. The role of switch b in FIG. 19 is played by Vb3 and Vb4 in FIG. 29.

Further, though not shown in FIG. 29, the number of switches for controlling the current flowing into transmission coil 4 can be increased by connecting a circuit which comprises Vb1-Vb2 and a circuit composed of input transistors 1801, 1802, 1803 and 1804 as a minimum unit in parallel with transmission coil 4. This circuit which comprises the minimum unit can control the current flowing into transmission coil 4 in steps by controlling switches Vb1 to Vb4 in steps such that they temporally have shifts.

The interface circuit of the present invention comprises a coil implementation and a circuit implementation which can cancel noise through a differential transmission which utilizes the aforementioned differential circuit.

A transmission device available for performing such a differential transmission may comprise (A) two transmission circuits shown in FIG. 12, each of which comprises one transmission coil, with the two transmission coils being arranged to generate therefrom magnetic field signals, the phases of which are inverted by 180° from each other.

Alternatively, the transmission device available for the purpose may comprise (B) a single transmission circuit which contains two transmission coils arranged in parallel, with the two transmission coils being arranged to generate therefrom magnetic field signals, the phases of which are inverted by 180° from each other.

Alternatively, the transmission device available for the purpose may comprise (C) a single transmission circuit which contains two transmission coils arranged in series, with the two transmission coils being arranged to generate therefrom magnetic field signals, the phases of which are inverted by 180° from each other.

Figure 30:
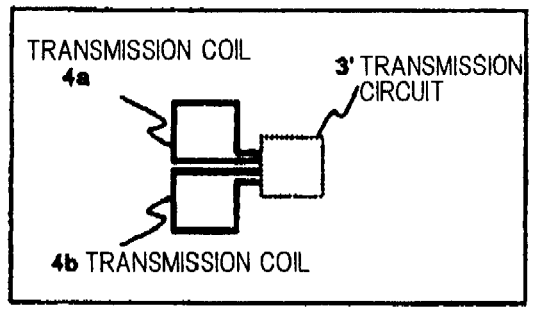
FIG. 30 is a plan view of a semiconductor chip including a transmission device comprising a transmission circuit which contains two transmission coils disposed so as to generate magnetic field signals, the phase of which are inverted by 180° from each other, from the transmission coils.

FIG. 30 is a top plan view of a semiconductor chip in which a transmission device comprises single transmission circuit 3' which contains two transmission coils 4a and 4b disposed so as to generate magnetic field signals, the phases of which are inverted by 180° from each other, from transmission coils 4a and 4b.

In this regard, it is preferable to employ a reception circuit which comprises two reception coils in the same configuration corresponding to transmission coils 4a and 4b on the transmission circuit side, as a reception circuit corresponding to the transmission circuit. However, the reception coils need not have the same size as the transmission coils. Also, the size of the coils may be adjusted in order to accomplish a desired reception sensitivity.

Figure 31:
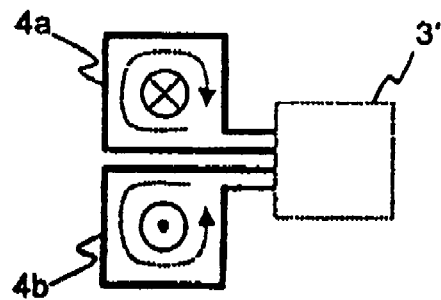
FIG. 31 is a plan view showing the orientation of currents flowing through the transmission coils of the semiconductor chip shown in FIG. 30, and magnetic fields generated from the currents.

FIG. 31 is a plan view showing the orientations of currents flowing through transmission coils 4a and 4b of the semiconductor chip shown in FIG. 30, and magnetic fields generated from the currents. Transmission circuit 3' applies currents to transmission coils 4a and 4b such that they generate magnetic fields in orientations opposite to each other. Though not shown because of the same configuration, the reception magnetic fields of the reception coils are also oriented in opposite directions in a manner similar to the transmission coils. In this way, a differential transmission of the magnetic field is performed between the two transmission coils and two reception coils, thus making it possible to realize a semiconductor device which cancels in-phase noise that is introduced from the outside and which excels in noise resistance characteristics.

Figure 32:
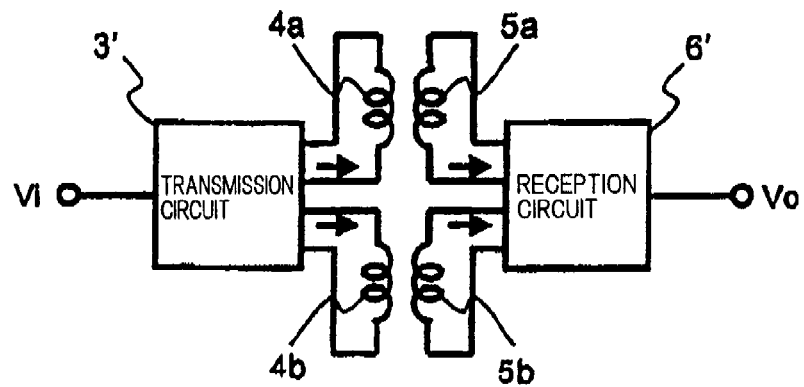
FIG. 32 is a block diagram of the transmission circuit shown in FIGS. 30 and 31.

FIG. 32 is a block diagram of the transmission circuit shown in FIGS. 30 and 31. Data signal Vi is applied to transmission circuit 3', and a triangular-wave current shaped by transmission circuit 3' is applied to two transmission coils 4a and 4b. Magnetic field signals output from two transmission coils 4a and 4b are signals, the phases of which are inverted by 180° from each other, and which are received by reception coils 5a and 5b. Voltages induced in reception coils 5a and 5b present waveforms similar to rectangular waves having wide pulse widths, so that reception voltage Vo can be provided by receiving them at a differential circuit.

Figure 33:
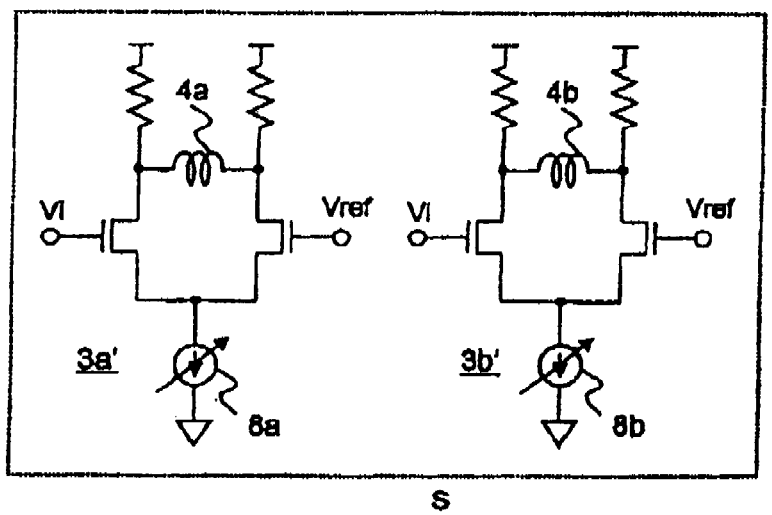
FIG. 33 is a circuit diagram showing an exemplary transmission circuit shown in FIGS. 30 and 31.

FIG. 33 is a circuit diagram showing an exemplary transmission device which comprises the transmission circuit shown in FIGS. 30 and 31. Transmission device S shown in FIG. 33 comprises, for example, two transmission circuits shown in FIG. 12, and each transmission circuit 3a' and 3b' comprises one transmission coil 4a or 4b. The two transmission coils 4a and 4b are arranged such that respective transmission coils 4a and 4b generate magnetic field signals, the phases of which are inverted by 180° from each other. Variable current sources 8a or 8b contained in respective transmission circuits 3a' and 3b are the same as the previously stated variable current sources.

Figure 34:
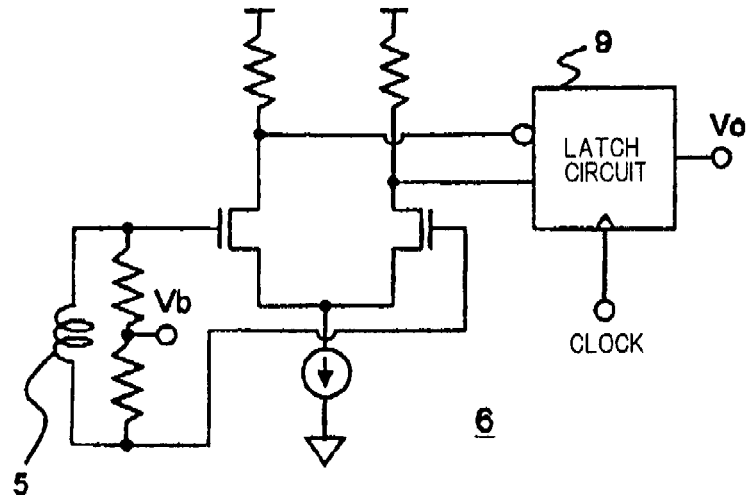
FIG. 34 is a circuit diagram showing an exemplary reception circuit.

Here, a reception circuit will be described. FIG. 34 is a circuit diagram showing an exemplary reception circuit. Reception circuit 6, roughly divided, is comprised of reception coil 5, a differential circuit, and latch circuit 9. Reception coil 5 and two resistors for determining median point (Vb) of a voltage induced by reception coil 5 are connected in parallel between two input terminals of the differential circuit. Two outputs of the differential circuit are connected to latch circuit 9, such that single end reception signal Vo is output from latch circuit 9.

Figure 35:
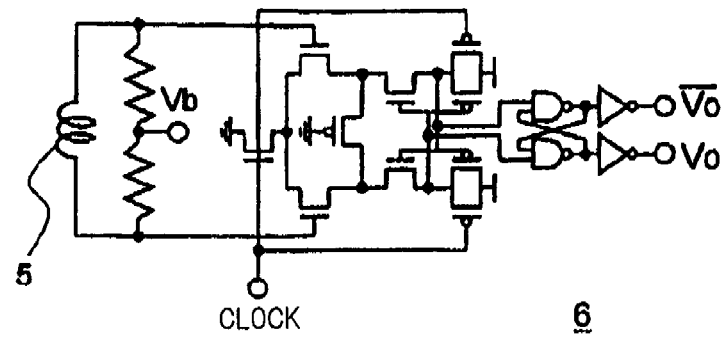
FIG. 35 is a circuit diagram showing another exemplary reception circuit.

FIG. 35 is a circuit diagram showing another exemplary reception circuit, where, as is the case with FIG. 34, a reception coil and two resistors for determining median point (Vb) of a voltage induced by the reception coil are connected in parallel between two input terminals of a differential circuit. In reception circuit 6, a reception signal is finally output as a differential signal of Vo and Vo bar.

Figure 36:
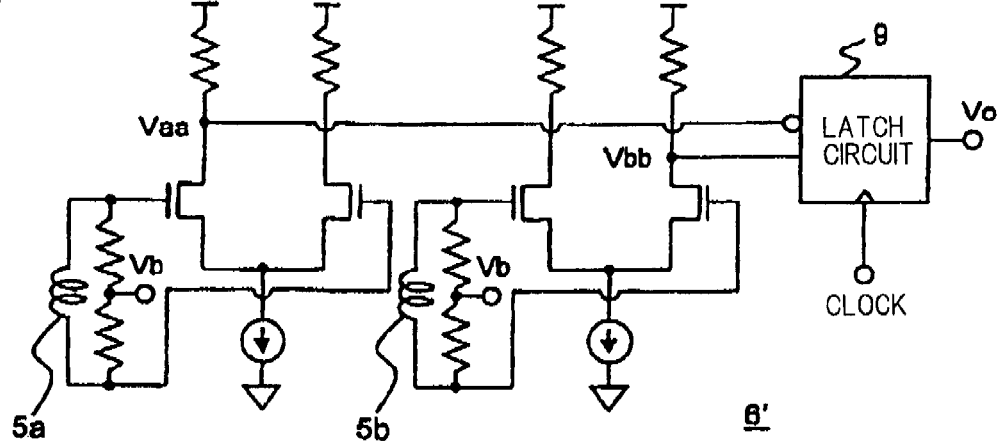
FIG. 36 is a circuit diagram showing an exemplary reception circuit which is provided with a reception coil in series.

FIG. 36 is a circuit diagram showing an exemplary reception circuit which is provided with a reception coil in series. In reception circuit 6', reception coils are disposed in series, and two differential circuits except for latch circuit 9, within the reception circuit shown in FIG. 34, are arranged, with their outputs being applied to single latch circuit 9. Since reception circuit 6' has such a circuit configuration, the differential transmission using two transmission coils can be accomplished, as described in FIGS. 30-33.

Figure 37:
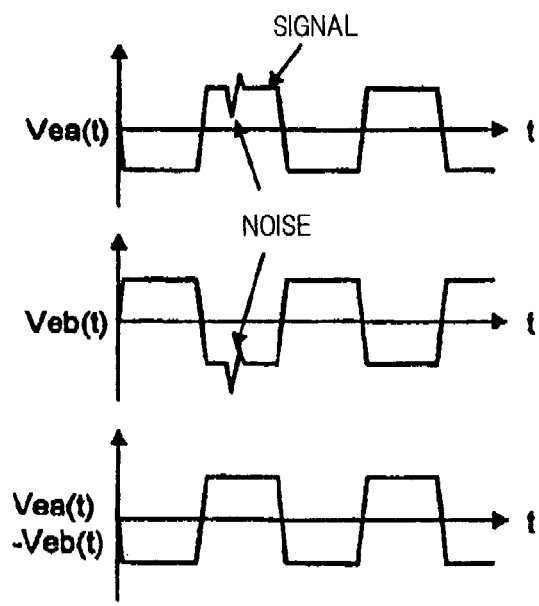
FIG. 37 is a waveform chart showing a voltage waveform that is induced to the reception coil when in-phase noise is introduced into the reception coil in the present invention.

FIG. 37 is an induced voltage waveform in a reception coil when in-phase noise is introduced into the reception coil in the present invention. While the in-phase noise is introduced into Vea(t) and Veb(t), the difference in the in-phase noise is canceled because of the differential transmission.

Figure 10:
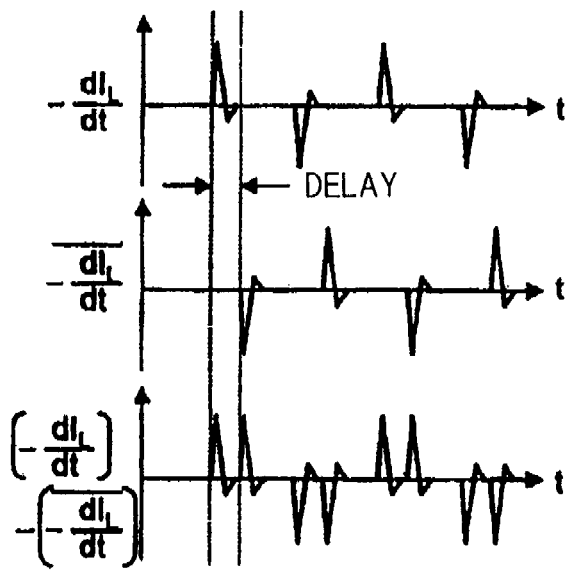
FIG. 10 is an explanatory diagram showing an example of a failure in receiving a signal due to a slight delay.
Figure 38:
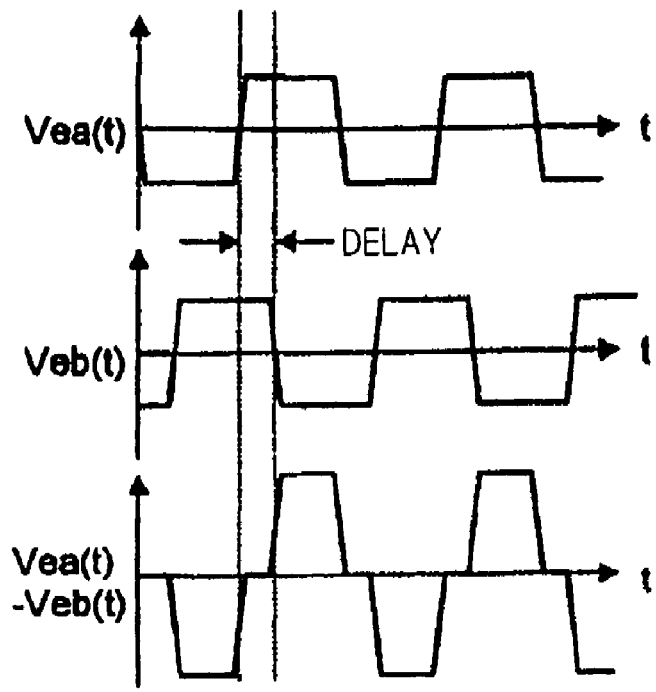
FIG. 38 is an explanatory diagram of a differential transmission for canceling noise.

FIG. 38 is an explanatory diagram for describing the differential transmission for canceling noise. In the prior art, as shown in FIG. 10, since the reception signal has a narrow pulse width by principle, as described above, a slight delay caused by variations in elements within the semiconductor, variations in the shape of the coil and the like would result in a failure in not only canceling the in-phase noise but also in correctly capturing the reception signal. However, by applying the aforementioned differential transmission to the interface circuit of the present invention as shown in FIG. 38, the pulse width is extended, so that a differential waveform can be reproduced even with a slight delay. In other words, advantageously, a differential signal can be correctly reproduced even if there is a delay caused by variations in wiring paths and elements.

Figure 39:
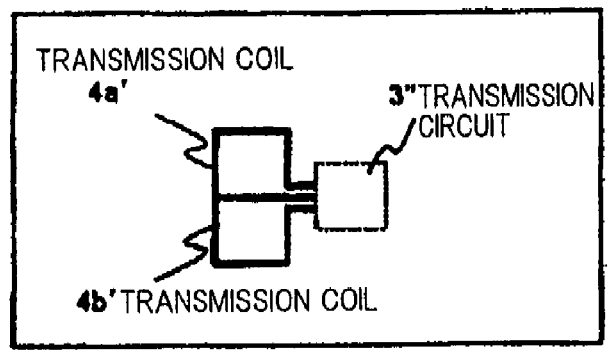
FIG. 39 is a plan view of a semiconductor chip including a transmission device comprising a transmission circuit which contains two transmission coils disposed in parallel so as to generate magnetic field signals, the phases of which are inverted by 180° from each other, from the transmission coils.

FIG. 39 is a plan view of a semiconductor chip including a transmission device which comprises single transmission circuit 3" which contains two transmission coils 4a' and 4b' disposed in parallel so as to generate magnetic field signals, the phase of which are inverted by 180° from each other, from transmission coils 4a' and 4b'. Transmission circuit 3" in this implementation is preferable in that its structure can be more simplified. In this regard, a reception circuit is preferably in a similar configuration as well.

Figure 40:
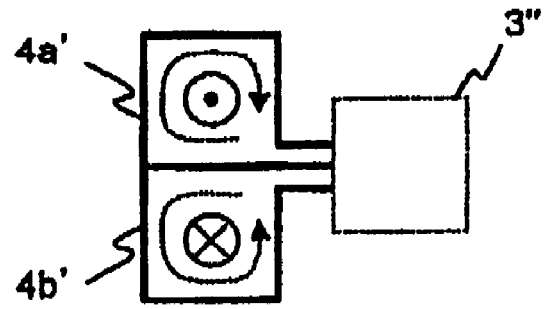
FIG. 40 is a plan view showing the orientation of currents flowing through the transmission coils of the semiconductor chip shown in FIG. 39, and magnetic fields generated from the currents.

FIG. 40 is a plan view showing the orientations of currents flowing through transmission coils 4a' and 4b' in the semiconductor chip shown in FIG. 39, and magnetic fields generated from the currents. Transmission circuit 3" applies currents to transmission coils 4a' and 4b' such that they generate magnetic fields in opposite orientations to each other. Though not shown because they have the same configuration, the reception magnetic fields of the reception coils are also oriented in opposite directions in a manner similar to the transmission coils. In this way, a differential transmission of the magnetic field is performed between the two transmission coils and two reception coils, thus making it possible to realize a semiconductor device which cancels in-phase noise is introduced from the outside and which excels in noise resistance characteristics.

Figure 41:
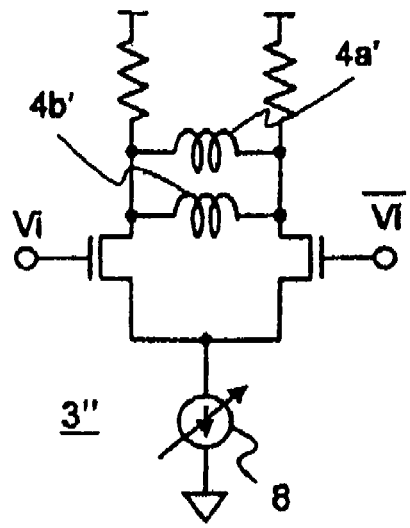
FIG. 41 is a circuit diagram showing an exemplary transmission circuit shown in FIGS. 39 and 40.

FIG. 41 is a circuit diagram showing an example of transmission circuit 3" shown in FIGS. 39 and 40. This transmission circuit 3" is a transmission device which comprises two transmission coils 4a" and 4b" inserted in parallel, for example, in the transmission circuit shown in FIG. 12. Variable current source 8 contained in transmission circuit 3" is the same as the previously stated variable current source.

Figure 42:
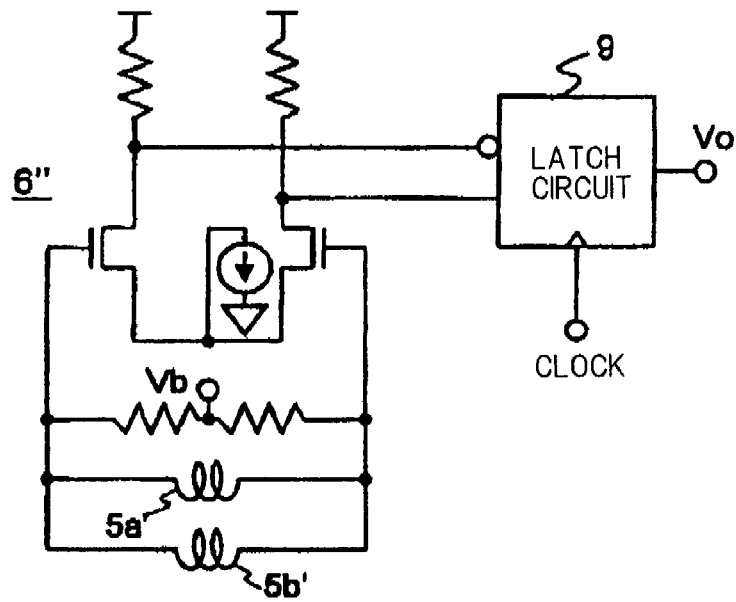
FIG. 42 is a circuit diagram showing an exemplary reception circuit which comprises reception coils disposed in parallel.

FIG. 42 is a circuit diagram showing an exemplary reception circuit which comprises reception coils disposed in parallel. Reception circuit 6", roughly divided, is comprised of two reception coils 5a' and 5b', a differential circuit, and latch circuit 9. Two reception coils 5a' and 5b' and two resistors for determining median point (Vb) of voltages induced by reception coils 5a' and 5b' are connected in parallel between two input terminals of the differential circuit. Two outputs of the differential circuit are connected to latch circuit 9, such that single end reception signal Vo is output from latch circuit 9. By thus creating two transmission/reception coils in a single transmission/reception circuit, the interface unit can be reduced in circuit scale. Also advantageously, variations between differential pairs can be prevented, as compared with the example of FIG. 33 which provides two differential circuits.

Figure 43:
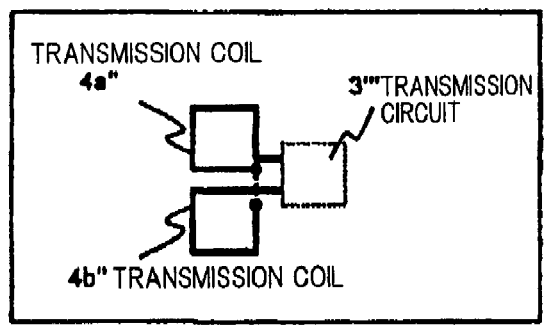
FIG. 43 is a plan view of a semiconductor chip including a transmission device comprising a transmission circuit which contains two transmission coils disposed in series so as to generate magnetic field signals, the phases of which are inverted by 180° from each other, from the transmission coils.

FIG. 43 is a plan view of a semiconductor chip including a transmission device comprising single transmission circuit 3''' which contains two transmission coils 4a" and 4b" disposed in series so as to generate magnetic field signals, the phases of which are inverted by 180° from each other, from the transmission coils 4a" and 4b". Transmission circuit 3''' in this implementation has two transmission coils 4a" and 4b" connected in series. This transmission device is preferable in that its structure can be more simplified, as is the case with the parallel implementation of FIG. 39. For a reception circuit, a similar implementation is preferable.

Figure 44:
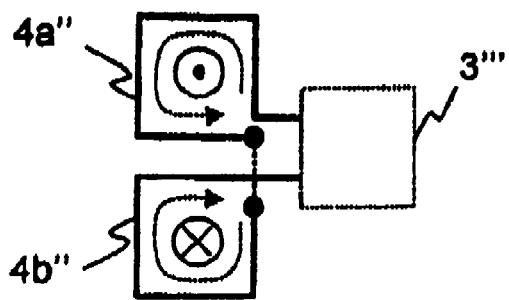
FIG. 44 is a plan view showing the orientation of currents flowing through the transmission coils of the semiconductor chip shown in FIG. 43, and magnetic fields generated from the currents.

FIG. 44 is a plan view showing the orientations of currents flowing through transmission coils 4a" and 4b" of the semiconductor chip shown in FIG. 43, and magnetic fields generated from the currents. Transmission circuit 3''' generates magnetic fields in opposite orientations to each other to transmission coils 4a" and 4b". Though not shown because they have the same configuration, the reception magnetic fields of the reception coils are also oriented in opposite directions in a manner similar to the transmission coils. In this way, a differential transmission of the magnetic field is performed between the two transmission coils and two reception coils, thus making it possible to realize a semiconductor device which cancels in-phase noise that is introduced from the outside and which excels in noise resistance characteristics.

Figure 45:
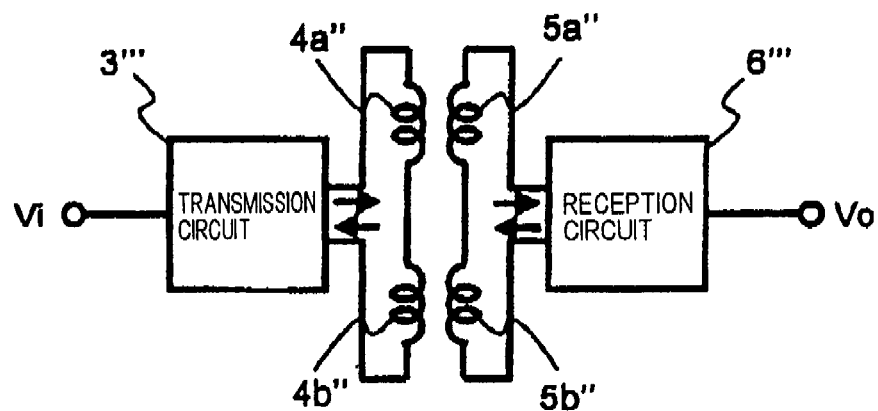
FIG. 45 is a block diagram of a transmission circuit shown in FIGS. 43 and 44.

FIG. 45 is a block diagram of the transmission circuit shown in FIGS. 43 and 44. Data signal Vi is applied to transmission circuit 3''', and a triangular-wave current shaped by transmission circuit 3''' is applied to two transmission coils 4a" and 4b" arranged in series. Magnetic field signals generated from two transmission coils 4a" and 4b" are signals, the phases of which are inverted by 180° from each other, and are received by reception coils 5a" and 5b". Voltages induced in reception coils 5a" and 5b" present waveforms similar to rectangular waves having wide pulse widths, so that reception voltage V0 can be provided by receiving them at a differential circuit.

Figure 46:
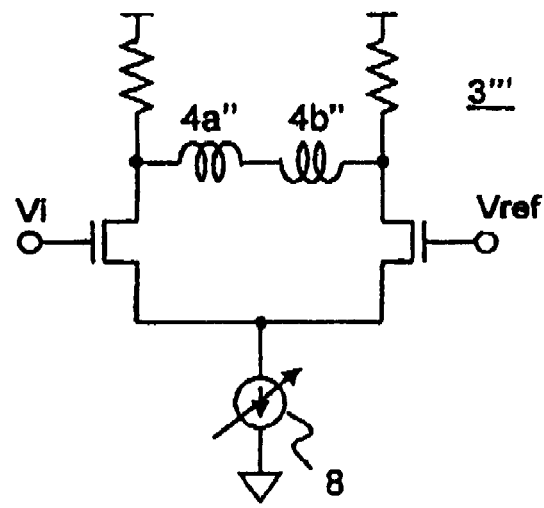
FIG. 46 is a circuit diagram showing an example of the transmission circuit shown in FIGS. 43 and 44.

FIG. 46 is a circuit diagram showing an example of transmission circuit 3''' shown in FIGS. 43 and 44. This transmission device is a transmission device which has two transmission coils 4a" and 4b" inserted, for example, in series to the transmission circuit shown in FIG. 12. Variable current source 8 contained in transmission circuit 3a''' is the same as the previously stated variable current source.

Figure 47:
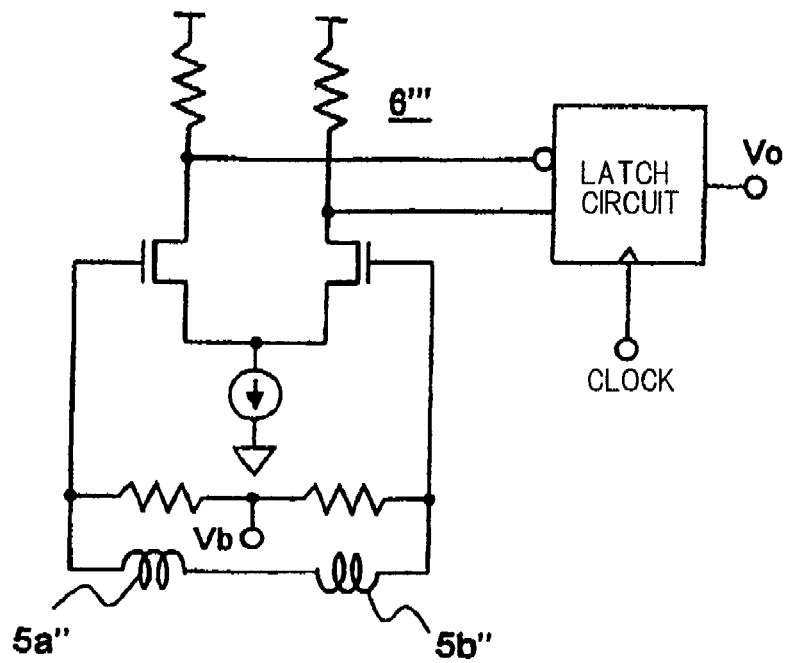
FIG. 47 is a circuit diagram showing an exemplary reception circuit which comprises reception coils disposed in series.

FIG. 47 is a circuit diagram showing an exemplary reception circuit which comprises reception coils disposed in series. Reception circuit 6''', roughly divided, is comprised of two reception coils 5a" and 5b", a differential circuit, and a latch circuit. The reception coils connected in series and two resistors for determining median point (Vb) of voltages induced by reception coils are connected in parallel between two input terminals of the differential circuit. Two outputs of the differential circuit are connected to the latch circuit, such that single end reception signal Vo is output from this latch circuit. By thus creating two transmission/reception coils in a single transmission/reception circuit, the interface unit can be reduced in circuit scale. Also advantageously, variations between differential pairs can be restrained, as compared with the example of FIG. 32 which provides two differential circuits.

As described above, since the two transmission coils contained in the transmission device generate magnetic field signals, the phases of which are inverted by 180° from each other, the transmission/reception of signals between the transmission coils and reception coils forms a differential transmission, thus making it possible to cancel extraneous noise. Further, since the pulse width of the reception signal becomes wider, the reproduction of the waveform of the differential transmission due to a delay is facilitated. Also, since the transmission circuit is simplified and variations inherent in circuit manufacturing are reduced by disposing the transmission coils in series or in parallel, the resistance to noise is improved.

(Use Mode of Interface Circuit)

Next, a description will be given of a use mode of the interface circuit according to the present invention.

Figure 48:
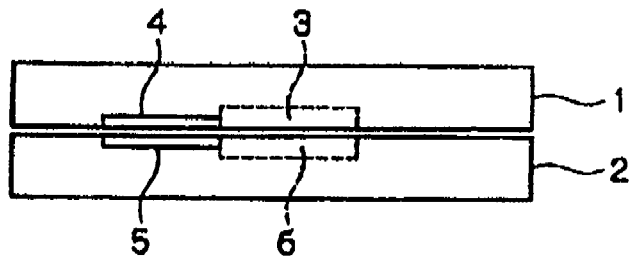
FIG. 48 is a cross-sectional view showing another exemplary semiconductor device which comprises the interface circuit of the present invention.

FIG. 48 is a cross-sectional view showing another exemplary semiconductor device which comprises the interface circuit of the present invention. Unlike the semiconductor device previously described in FIG. 11, this semiconductor device comprises transmission coil 4 and reception coil 5 arranged in opposite orientation. In this way, on the contrary, the positional relationship between transmission coil 4 and reception coil 5 may be opposite or back-to back. However, since the shorter the distance between the transmission/reception coils, the greater is the reduction in power consumption used in signal transmission between the coils, the implementation exemplified in FIG. 48 requires lower power consumption for signal transmission.

In the semiconductor devices shown in FIGS. 11 and 48, circuit chips are stacked such that transmission coil 4 is disposed on one circuit chip at the same position, as viewed in perspective, as that at which reception coil 5 is disposed on the other circuit chip.

As an exception, only when a signal is intentionally transmitted to the outside of the semiconductor device, or only when a signal is intentionally received from the outside of the semiconductor device, the circuit chips may be stacked such that transmission coils alone, or reception coils alone are disposed at the same locations, as viewed in perspective.

For example, when one wishes to monitor the operation of the circuit chips within the semiconductor device from the outside, each circuit chip is provided with a transmission coil for transmitting a signal toward a reception coil located outside of the semiconductor device, separately from the transmission coils for use in signal transmissions between the circuit chips.

On the other hand, when one wishes to control a test operation of the semiconductor device from the outside, each circuit chip is provided with a reception coil for receiving a signal transmitted from a transmission coil located outside of the semiconductor device, separately from the reception coil for use in signal transmissions between the circuit chips.

Thus, by providing transmission coils or reception coils for operation monitoring and test operation as well as a transmission device or a reception device, the operation monitoring and test operation can be readily performed not only for circuits situated in a surface layer of stacked circuit chips but also for circuits situated in internal layers.

Figure 49:
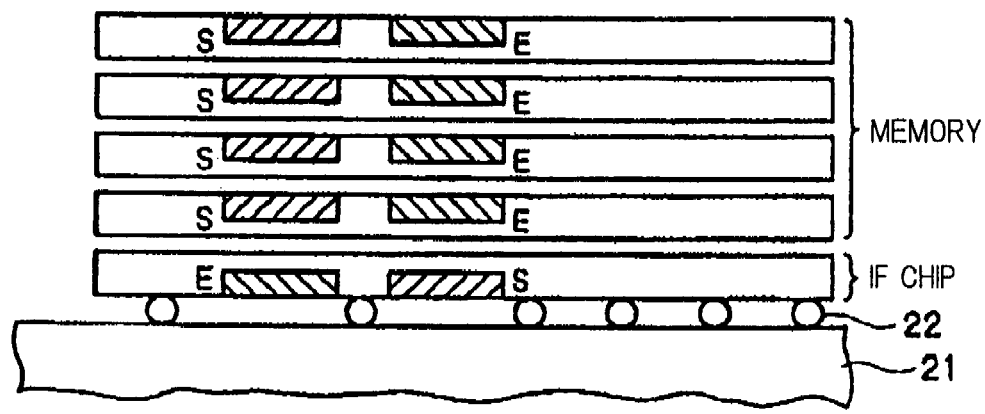
FIG. 49 is a schematic cross-sectional view showing an example which utilizes the interface circuit of the present invention for a transmission between stacked chips.

FIG. 49 is an exemplary semiconductor module which utilizes the interface circuit of the present invention for signal transmissions between three or more stacked circuit chips. This semiconductor module comprises semiconductor circuit chips stacked on printed circuit board 21, where signal transmissions are performed through the interface circuit of the present invention not only between an upper and a lower circuit chip which are directly in contact but also between circuit chips which are vertically stacked thereon.

Here, assume that the circuit chip located on the lowest layer is labeled an IF (interface) chip, and a one-to-multiple signal transmission is performed between the IF chip and circuit chips which are stacked thereon. For example, all the circuit chips stacked thereon are memory chips, and are arranged such that transmission device S of the IF chip matches the position of reception devices E of all the memory chips. In this way, since magnetic field signals generated from transmission device S of the IF chip can be received by all the memory chips at the same timing, a fast write into the memories can be accomplished.

Generally, when a signal is transmitted to circuit chips which are stacked in multiple layers in a non-contact manner, a considerable amount of noise occurring in the intervening circuit chips is highly likely to introduce into a magnetic field signal from the IF chip before it reaches the furthest circuit chip. In contrast, in the present invention, the magnetic signal transmitted from the transmission coil is readily distinguished from the noise that is occurring in the circuit chip, as described above, so that secure signal transmissions can be carried out.

Also, in the semiconductor module shown in FIG. 49, by piling transmission devices S of all the memory chips and single reception device E of the IF chip on printed circuit board 21, magnetic field signals generated from multiple transmission coils can be received by a single reception coil. As a result, information can be retrieved from the memory at high speeds while using a small number of signal transmission lines. In this event, signal transmissions from the respective memory chips to the IF chip, for example, can be reliably performed in a time division manner. Further, while the large amount of noise that is occurring in the intervening circuit chips can be included likewise in this embodiment, the transmission coils generate magnetic field signals which are readily distinguished from the noise occurring in the circuit chips, as described above, so that reliable signal transmissions can be carried out.

Connection means 22 such as solder balls, metal bumps or the like is formed between printed circuit bard 21 which forms part of the semiconductor module and the IF chip in FIG. 49. Connection means 22 is not required when printed circuit board 21, which forms part of the semiconductor module, supports the interface circuit, but such a structure may be employed if printed circuit board 21 supports the interface circuit not. When the IF chip is additionally provided with a function of converting a non-contact mode signal to a conventional contact mode signal, the semiconductor module can be utilized using conventional circuit design technologies.

Figure 50:
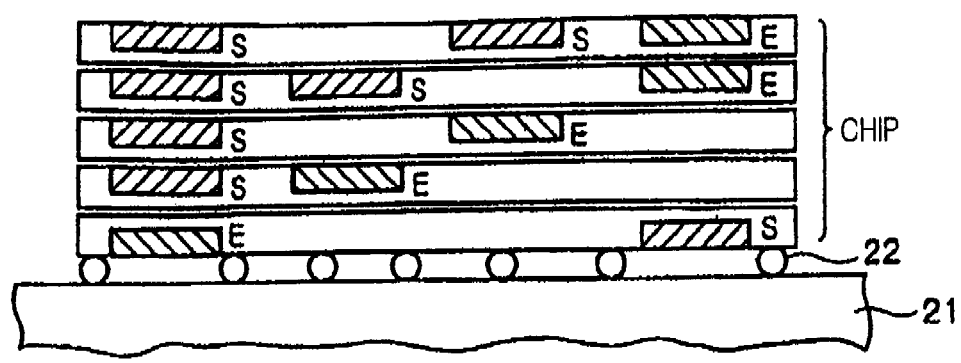
FIG. 50 is a schematic cross-sectional view showing another example which utilizes the interface circuit of the present invention for a transmission between stacked chips.

FIG. 50 is another exemplary semiconductor module which utilizes the interface circuit of the present invention for signal transmissions among three more stacked circuit chips. In this example, transmission device S and reception device E are selectively arranged instead of being arranged at the same positions on each circuit chip.

For example, at the right end, transmission device S is formed only on the lowermost circuit chip, such that a magnetic field signal generated therefrom is received only by each of reception devices S of each of two circuit chips thereabove. In a portion located to the left, a magnetic field signal generated from the topmost circuit chip is received by a circuit chip which is the third one from the above, and a magnetic field signal generated from the second circuit chip is received by the fourth circuit chip from above.

By selectively arranging transmission devices S and reception devices E in this way, signal transmission positions can be freely designed among the circuit chips. Since the present invention utilizes magnetic field signals which are less susceptible to noise, the signal transmission positions can be more freely selected. Though a detailed plan view is not shown, in a state where transmission device S is placed on reception device E, the transmission coil is opposite to the reception coil, where a transmission coil forming area may partially is opposite to a reception coil forming area. Also, more preferably, the transmission efficiency can be improved by aligning the center axis of the transmission coil to that of the reception coil.

The semiconductor module of the present invention may comprise a function unit for generating another signal, other than the semiconductor device of the present invention. In this semiconductor module, while the other signal generated by the function unit may act as noise to affect the signal transmission, the effect of the noise can be restrained because the semiconductor module of the present invention uses a triangular or roughly triangular wave signal. The function unit for generating another signal may be formed in a semiconductor device as a circuit, or mounted on a printed circuit board together with the semiconductor device of the present invention. In addition, the function unit may be an oscillator, a clock operation part, a DC/DC converter and the like.

Also, by applying the semiconductor module which comprises the interface circuit of the present invention to a portable terminal, effects are produced such as the ability for large capacity signal transmission at high speeds together with a lower susceptibility to noise. In a portable terminal such as a portable telephone, a large memory capacity is required together with a CPU (central processing unit) chip for communication in order to support the trend of increased speeds of radio communications. Also, a large memory capacity is required together with a CPU chip for application in order to process software such as games at high speeds.

By using the semiconductor module of the present invention, a high-speed and large-capacity signal transmission can be accomplished between CPUs and memories by providing each CPU with the function of the IF chip, to realize a high-performance portable terminal.

Also, due to a radio communication function provided in a portable terminal, there is a concern that radio signals generated by the radio communication function can be introduced into a non-contact signal according to the present invention, but such a concern is solved because the present invention utilizes a signal transmission method which is resistant to such introduced noise. The semiconductor module herein can illustrate an implementation which comprises memory chips stacked on a printed circuit board which comprises one CPU for communication and one CPU for application.

Figure 51:
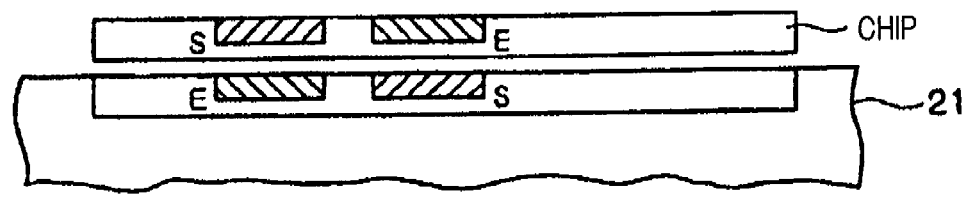
FIG. 51 is a schematic cross-sectional view showing an example which has the interface circuit of the present invention mounted in a printed circuit board.

FIG. 51 is a schematic cross-sectional view showing an example in which the interface circuit of the present invention is mounted in a printed circuit board.

Conventionally, when a circuit chip is mounted on a printed circuit board, connection means such as solder balls, metal bumps and the like has been used between the both circuit chip and board. In situations when electronic devices are actually used, since the temperature varies, cracks that reach the connection means due to the difference between the coefficient of thermal expansion of the circuit chip and the coefficient of thermal expansion of the printed circuit board are a problem that has never been solved.

The present invention, however, can use resin-based adhesives which are widely used, such as epoxy resin, without using a metal connection means such as solder balls, metal bumps and the like, thus making it possible to securely connect the circuit chip to the printed circuit board and have improved reliability of the signal connection. Though not shown in the aforementioned semiconductor device, semiconductor module, memory module, and portable terminal, it is preferable to use an adhesive which does not contain metal particles such as resin-based adhesives, in order to secure connect the circuit chips. If a conductive adhesive such as one containing metal particles were used, the metal particles would cause the magnetic field strength to be transformed into heat, and the power that is used for signal transmission would be wasted.

The present application has described a case where a signal applied to the transmission circuit is a rectangular voltage waveform. This is because current general circuits are driven by rectangular voltage waveforms. However, any signal may be applied to the transmission circuit as long as a magnetic field waveform output from the transmission coil is a triangular wave or a roughly triangular wave. For example, it may be a rectangular-wave current waveform.

Also, while the circuit chips shown in the embodiments of the semiconductor device, semiconductor module, memory module, portable terminal of the present invention have been shown in the same size for convenience, they are not so limited, and they are not limited to the size of the illustrated circuit chips, simply requiring that the circuit chips are piled one on another such that the transmission coil opposes the reception coil.

The invention claimed is:

1. A transmission method of performing a signal transmission in a non-contact manner through an electromagnetic induction based on a magnetic field signal output by a transmission coil,
    wherein said transmission coil outputs a triangular or roughly triangular magnetic field signal;
    said magnetic field signal is generated by providing said transmission coil with a current signal shaped through current switch processing performed by a transmission circuit connected to said transmission coil;
    said current switch processing is performed by a circuit which comprises a plurality of variable current sources and a plurality of switches connected to said variable current sources respectively;
    said plurality of variable current sources have the same current flowing through each of the variable current sources;
    said current signal is generated by adding currents from the variable current sources, which are connected to the switches that are turned on, from among the plurality of variable current sources;
    said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and
    said transmission circuit changes the direction of the current signal, which flows through the transmission coil, in accordance with changing a data level of the transmission signal.

2. The transmission method according to claim 1, wherein said triangular wave or said roughly triangular wave is a waveform which continuously increases or decreases, or a waveform which increases or decreases in steps.

3. The transmission method according to claim 1, wherein said current signal is smoothed by a smoothing circuit before it is provided to said transmission coil.

4. The transmission method according to claim 1, wherein two of said transmission coils are provided, and magnetic field signals generated by said respective transmission coils are transmitted with their phases being inverted by 180° from each other.

5. An interface circuit for performing a signal transmission through electromagnetic induction, comprising:
    a transmission coil; and
    a transmission circuit that provides a current signal to said transmission coil to output a triangular or roughly triangular magnetic field signal from said transmission coil;
    wherein:
        said transmission circuit comprises a current switch processing circuit that performs current switch processing;
        said current switch processing circuit comprises a plurality of variable current sources, and a plurality of switches connected to said variable current sources respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with the a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

6. The interface circuit according to claim 5, wherein said triangular wave or said roughly triangular wave is a waveform which continuously increases or decreases, or a waveform which increases or decreases in steps.

7. The interface circuit according to claim 5, wherein said transmission circuit comprises a smoothing circuit that smoothes a signal output from said current switch processing circuit.

8. The interface circuit according to claim 5, wherein two of said transmission coils are provided, and magnetic field signals generated by said respective transmission coils are transmitted with their phases being inverted by 180° from each other.

9. A semiconductor device comprising a transmission coil, and a transmission circuit that provides said transmission coil with a current signal to output a triangular or roughly triangular magnetic field signal from said transmission coil;

wherein:

said transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

10. The semiconductor device according to claim 9, wherein said triangular wave or said roughly triangular wave is a waveform which continuously increases or decreases, or a waveform which increases or decreases in steps.

11. The semiconductor device according to claim 9, wherein said transmission circuit comprises a smoothing circuit that smoothes a signal output from said current switch processing circuit.

12. The semiconductor circuit according to claim 9, wherein two of said transmission coils are provided, and magnetic field signals generated by said respective transmission coils are transmitted with their phases being inverted by 180° from each other.

13. The semiconductor device according to claim 9, wherein said semiconductor device including a reception coil is stacked.

14. The semiconductor device according to claim 9, wherein a plurality of semiconductor devices each including a reception coil are stacked.

15. The semiconductor device according to claim 9, wherein a plurality of semiconductor devices each including at least said transmission coil are stacked on a semiconductor device having a reception coil.

16. The semiconductor device according to claim 9, further comprising another semiconductor device which is stacked between a semiconductor device, which includes said transmission coil and said transmission circuit, and a semiconductor device including said reception coil.

17. A semiconductor package comprising:

a semiconductor device that comprises a transmission coil, and a transmission circuit that provides said transmission coil with a current signal to output a triangular or roughly triangular magnetic field signal from said transmission coil; and a printed circuit board on which said semiconductor device is stacked;

wherein:

said transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

18. The semiconductor package according to claim 17, wherein said semiconductor device and said printed circuit board are electrically connected through a conductor.

19. The semiconductor package according to claim 17, wherein said printed circuit board comprises a reception coil.

20. A printed circuit board comprising a transmission coil, and a transmission circuit that provides a current signal to said transmission coil to output a triangular or roughly triangular magnetic field signal from said transmission coil;
wherein:
said transmission circuit comprises a current switch processing circuit that performs current switch processing;
said current switch processing circuit comprises a plurality of variable current sources, and a plurality of switches connected to said variable current sources, respectively
said plurality of variable current sources have the same current flowing through each of the variable current sources:
said current signal is generated by adding currents from the variable current sources, which are connected to the switches that are turned on, from among the plurality of variable current sources;
said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and
said transmission circuit changes the direction of the current signal, which flows through the transmission coil, in accordance with changing a data level of the transmission signal.

21. The printed circuit board according to claim 20, wherein said triangular wave or said roughly triangular wave is a waveform which continuously increases or decreases, or a waveform which increases or decreases in steps.

22. The printed circuit board according to claim 20, wherein said transmission circuit comprises a smoothing circuit that smoothes a signal output from said current switch processing circuit.

23. The semiconductor circuit according to claim 20, wherein two of said transmission coils are provided, and magnetic field signals generated by said respective transmission coils are transmitted with their phases being inverted by 180° from each other.

24. A semiconductor package comprising:
a printed circuit board that comprises a transmission coil, and a transmission circuit that provides a current signal to said transmission coil to output a triangular or roughly triangular magnetic field signal from said transmission coil; and
a semiconductor device stacked on said printed circuit board and including a reception coil;
wherein:
said transmission circuit comprises a current switch processing circuit that performs current switch processing;
said current switch processing circuit comprises a plurality of variable current sources, and a plurality of switches connected to said variable current sources respectively
said plurality of variable current sources have the same current flowing through each of the variable current sources:
said current signal is generated by adding currents from the variable current sources, which are connected to the switches that are turned on, from among the plurality of variable current sources;
said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and
said transmission circuit changes the direction of the current signal, which flows through the transmission coil, in accordance with changing a data level of the transmission signal.

25. The semiconductor package according to claim 24, further comprising another semiconductor device stacked between said printed circuit board and said semiconductor device.

26. The semiconductor package according to claim 24, further comprising a plurality of semiconductor devices stacked on said printed circuit board, each including a reception coil.

27. A semiconductor module comprising:
semiconductor devices each including a transmission coil, and a transmission circuit that provides said transmission coil with a current signal to output a triangular or roughly triangular magnetic field signal from said transmission coil; and
a printed circuit board on which said semiconductor devices are stacked,
wherein at least one of said semiconductor devices comprises a function unit that generates a signal that is different from the magnetic field signal;
wherein:
said transmission circuit comprises a current switch processing circuit that performs current switch processing;
said current switch processing circuit comprises a plurality of variable current sources, and a plurality of switches connected to said variable current sources respectively
said plurality of variable current sources have the same current flowing through each of the variable current sources:
said current signal is generated by adding currents from the variable current sources, which are connected to the switches that are turned on, from among the plurality of variable current sources;
said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

28. The semiconductor module according to claim 27, wherein said semiconductor device and said printed circuit board are electrically connected through a conductor.

29. The semiconductor device according to claim 27, wherein a transmission coil of at least one of said semiconductor devices is disposed at a position which is not opposite a transmission coil of another one of said semiconductor devices.

30. A memory module comprising:

a first semiconductor device that comprises a first transmission coil, and a first transmission circuit that provides said first transmission coil with a current signal to output a triangular or roughly triangular magnetic field signal from said transmission coil;

and a second semiconductor device including a reception coil, or a third semiconductor device comprising a printed circuit board including a second transmission coil, and a second transmission circuit that provides a signal to said second transmission coil to output a triangular or roughly triangular magnetic field signal from said transmission coil;

wherein at least one of said semiconductor devices is a memory;

wherein:

said first transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said first transmission circuit changes the direction of the current signal, which flows through the transmission coil, in accordance with changing a data level of the transmission signal.

31. A memory module comprising a printed circuit board including a reception circuit, and a semiconductor device stacked on said printed circuit board, said semiconductor device being a memory comprising a transmission coil and a transmission circuit that provides a current signal to said transmission coil to output a triangular or roughly triangular magnetic field signal from said transmission coil;

wherein:

said transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

32. The memory module according to claim 31, wherein said triangular wave or said roughly triangular wave is a waveform which continuously increases or decreases, or a waveform which increases or decreases in steps.

33. The memory module according to claim 31, wherein a plurality of said semiconductor devices are stacked.

34. A portable device comprising a semiconductor device including a transmission coil, and a transmission circuit that provides said transmission coil with a current signal to output a triangular or roughly triangular magnetic field signal from said first transmission coil;

wherein:

said transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

35. A portable device comprising a printed circuit board including a transmission coil, and a transmission circuit that provides a current signal to said transmission coil to output a triangular or roughly triangular magnetic field signal from said transmission coil;

wherein:

said transmission circuit comprises a current switch processing circuit that performs current switch processing;

said current switch processing circuit comprises a plurality of variable current sources, and a plurality of switches connected to said variable current sources, respectively said plurality of variable current sources have the same current flowing through each of the variable current sources:

said current signal is generated by adding currents from the variable current sources, which are connected to the switches that are turned on, from among the plurality of variable current sources;

said plurality of switches open and close, such that an absolute value of the amount of current of the current signal becomes a minimum value at the start of a single data width of a transmission signal, then the absolute value gradually becomes greater in accordance with a time course, then the absolute value becomes a maximum value at a center of the single data width, then the absolute value gradually becomes smaller in accordance with the time course, then the absolute value becomes the minimum value at the end of the single data width; and said transmission circuit changes the direction of the current signal, which flows through the transmission coil, in accordance with changing a data level of the transmission signal.

* * * * *